US012628652B2

(12) United States Patent
Yang et al.

(10) Patent No.: US 12,628,652 B2
(45) Date of Patent: May 12, 2026

(54) SUPPORTING SEALANT LAYER STRUCTURE FOR STACKED DIE APPLICATION

(71) Applicant: Taiwan Semiconductor Manufacturing Company, Ltd., Hsinchu (TW)

(72) Inventors: Che Wei Yang, New Taipei (TW); Kuo-Ming Wu, Zhubei (TW); Sheng-Chau Chen, Tainan (TW); Cheng-Yuan Tsai, Chu-Pei (TW); Hau-Yi Hsiao, Chiayi (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 470 days.

(21) Appl. No.: 18/298,064

(22) Filed: Apr. 10, 2023

(65) Prior Publication Data

US 2024/0339422 A1      Oct. 10, 2024

(51) Int. Cl.
H01L 23/48 (2006.01)
H01L 23/00 (2006.01)
(Continued)

(52) U.S. Cl.
CPC ............ H01L 24/08 (2013.01); H01L 23/562 (2013.01); H01L 24/03 (2013.01); H01L 24/80 (2013.01);
(Continued)

(58) Field of Classification Search
CPC ....... H01L 24/08; H01L 23/562; H01L 24/03;
H01L 24/80; H01L 24/06; H01L 2224/02235; H01L 2224/0226; H01L 2224/03011; H01L 2224/05611; H01L 2224/05644; H01L 2224/05655; H01L 2224/08145; H01L 2224/80895;
(Continued)

(56) References Cited

U.S. PATENT DOCUMENTS 10,163,864 B1    12/2018   England
11,869,869 B2    1/2024    Yu et al.
(Continued)

FOREIGN PATENT DOCUMENTS

CN        107644870 A  *  1/2018   ............. H01L 24/19
TW        201911535 A     3/2019
TW        202243055 A     11/2022

*Primary Examiner* — Niki H Nguyen
(74) *Attorney, Agent, or Firm* — Harrity & Harrity, LLP

(57)          ABSTRACT

Some implementations described herein provide techniques and apparatuses for forming a stacked die product including two or more integrated circuit dies. A bond interface between two integrated circuit dies that are included in the stacked die product includes a layered structure. As part of the layered structure, respective layers of a sealant material are directly on co-facing surfaces of the two integrated circuit dies. The layered structure further includes one or more bonding layers between the respective layers of the sealant material that are directly on the co-facing surfaces of the two integrated circuit dies. The layered structure may reduce lateral stresses throughout the bond interface to reduce a likelihood of warpage of the two integrated circuit dies.

20 Claims, 19 Drawing Sheets

(51) Int. Cl.
    *H01L 23/52*       (2006.01)
    *H01L 29/40*       (2006.01)

(52) U.S. Cl.
    CPC .... *H01L 24/06* (2013.01); *H01L 2224/02235* (2013.01); *H01L 2224/0226* (2013.01); *H01L 2224/03011* (2013.01); *H01L 2224/05611* (2013.01); *H01L 2224/05639* (2013.01); *H01L 2224/05644* (2013.01); *H01L 2224/05655* (2013.01); *H01L 2224/08145* (2013.01); *H01L 2224/80895* (2013.01); *H01L 2224/80896* (2013.01)

(58) Field of Classification Search
    CPC ........... H01L 2224/80896; H01L 24/05; H01L 2924/15311; H01L 2224/48227; H01L 2224/32145; H01L 21/187; H01L 2224/0401; H01L 2224/48247; H01L 2224/16227; H01L 2224/8034; H01L 2224/80201; H01L 25/0756; H01L 21/2007; H01L 2224/73204; H01L 2225/06517; H01L 2224/16; H01L 2224/04105; H01L 2224/48465; H01L 23/3128; H01L 2224/05008; H01L 2224/08146; H01L 2224/08235; H01L 25/0753; H01L 2224/12105; H01L 2224/13023; H01L 2224/4847; H01L 2224/05548; H01L 2224/05009; H01L 2224/13025; H01L 2224/13; H01L 24/09; H01L 2224/83203; H01L 25/043; H01L 2224/81192
    See application file for complete search history.

(56)                     References Cited

U.S. PATENT DOCUMENTS

2016/0043060 A1*   2/2016   Kabe ..................... H10W 90/00
                                                257/774
2016/0190103 A1*   6/2016   Kabe ..................... H01L 24/83
                                                257/777

* cited by examiner

700

202a 326a    324a    320a    322a

700

202a 322a     320a     324a     326a     328a

900

910  Form a layer of a siloxane-based compound across a first semiconductor substrate 920  Form a first bonding layer over the layer of the siloxane-based compound 930  Join the first bonding layer to a second bonding layer that is associated with a second semiconductor substrate

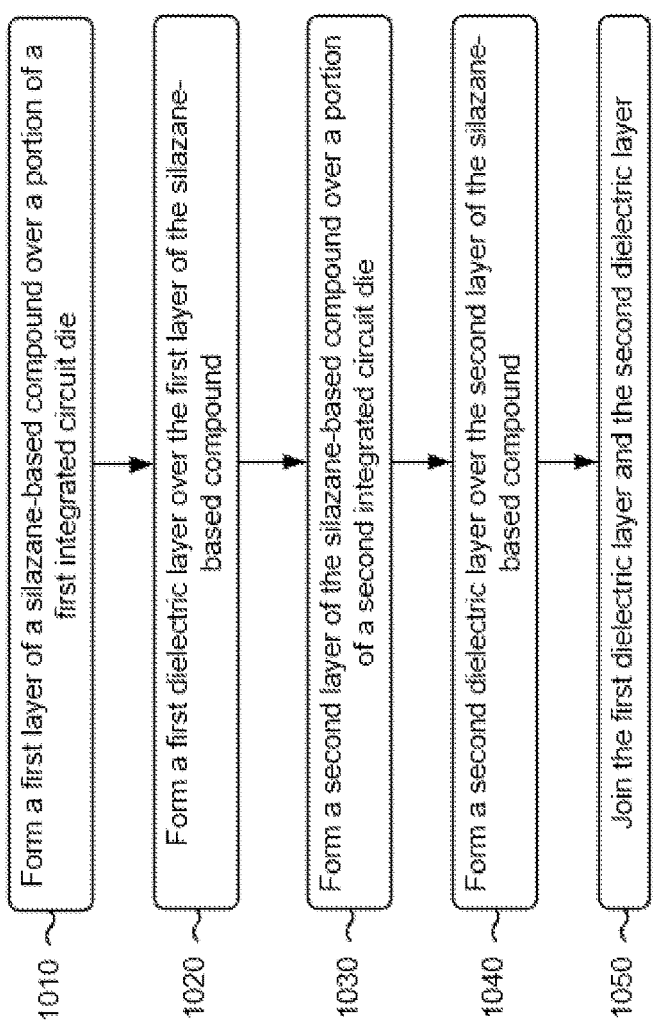

1000

1010 Form a first layer of a silazane-based compound over a portion of a first integrated circuit die 1020 Form a first dielectric layer over the first layer of the silazane-based compound 1030 Form a second layer of the silazane-based compound over a portion of a second integrated circuit die 1040 Form a second dielectric layer over the second layer of the silazane-based compound 1050 Join the first dielectric layer and the second dielectric layer

FIG. 10

SUPPORTING SEALANT LAYER STRUCTURE FOR STACKED DIE APPLICATION

BACKGROUND

A three dimensional integrated circuit (3DIC) assembly may include two or more integrated circuit (IC) dies that are stacked vertically and bonded along a bond line. The 3DIC assembly may be formed by stacking two or more semiconductor substrates including the two or more IC dies using a wafer bonding operation such as a Wafer-on-Wafer (WoW) bonding operation. After the bonding operation, the 3DIC assembly including the two or more IC dies may be diced from the stack of two or more semiconductor substrates and encapsulated in a semiconductor die package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9 and 10 are flowcharts of example processes associated with forming a supporting sealant layer for a stacked die application.

DETAILED DESCRIPTION

Figure 1:
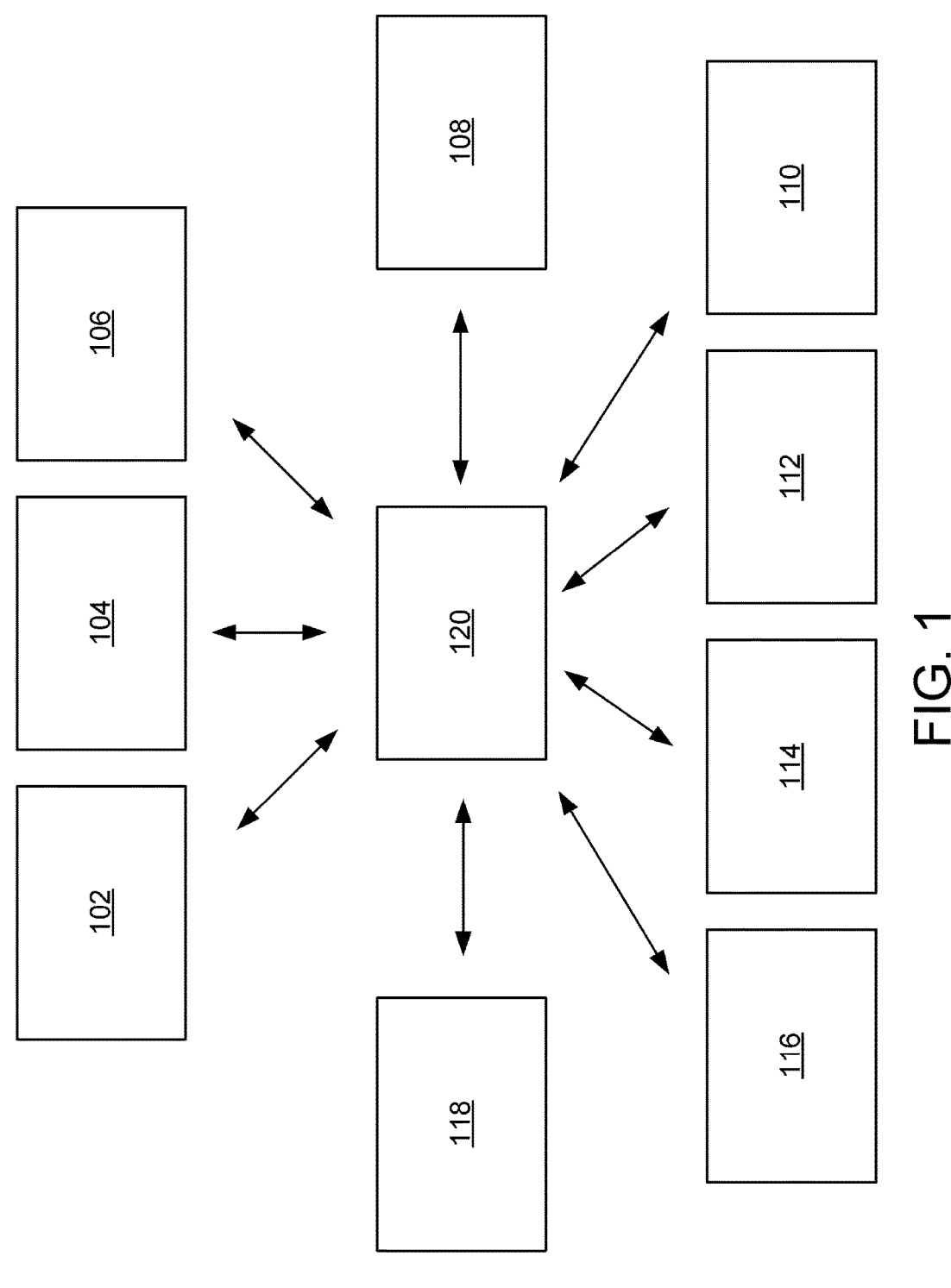
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a stacked die product, such as a wafer-on-wafer (WoW) product, may include a single material (e.g., a silicon oxynitride (SiON) material) that is shared along a bond interface between co-facing surfaces of two integrated circuit dies that are joined together. In some cases, lateral stresses present throughout such a bond interface may cause a warpage of the stacked die product. Additionally, such a bond interface may possess a rigidity characteristic that fails to sufficiently dampen vibrations and/or reduce stresses along the bond interface during an operation that thins the stacked die product. In such cases, the bond interface may crack or peel during the thinning operation, cause the two integrated circuit dies to separate, and render the stacked die product to be non-functional. Further, and to mitigate such warpage, cracking, and/or peeling, one or more additional processing operations may be implemented, such as a trimming operation along a perimeter of two or more semiconductor substrates that are joined as part of forming the stacked die product.

Some implementations described herein provide techniques and apparatuses for forming a stacked die product including two or more integrated circuit dies. A bond interface between two integrated circuit dies that are included in the stacked die product includes a layered structure. As part of the layered structure, respective layers of a sealant material are directly on co-facing surfaces of the two integrated circuit dies. The layered structure further includes one or more bonding layers between the respective layers of the sealant material that are over co-facing surfaces of the two integrated circuit dies. Relative to another bond interface structure not including the respective layers of the sealant material, the layered structure may reduce lateral stresses throughout the bond interface to reduce a likelihood of warpage of the two integrated circuit dies. Additionally, and relative to another bond interface structure not including the respective layers of the sealant material, the layered structure may include increased adhesive properties and/or increased vibration dampening properties. The reduction in lateral stresses, the increased adhesive properties, and/or the vibration dampening properties may reduce a likelihood of the bond interface cracking or peeling during a thinning operation that thins one or more of the two integrated circuit dies.

In this way, a yield of a stacked die product is increased relative to a yield of a stacked die product formed using a bond interface that does not include the layered structure. Additionally, or alternatively and in some implementations, a trimming operation along a perimeter of semiconductor substrates joined as part of forming the stacked die product may be eliminated. By increasing the yield of the stacked die product and eliminating the trimming operation, a consumption of resources for manufacturing a volume of the stacked die product (e.g., semiconductor manufacturing processing tools, raw materials, manpower, and/or computing resources) may be reduced.

FIG. 1 is a diagram of an example environment 100 in which systems and/or methods described herein may be implemented. As shown in FIG. 1, environment 100 includes a combination of semiconductor processing tools, including a deposition tool 102, an exposure tool 104, an etch tool 106, a bonding tool 108, a dispense tool 110, a planarization tool 112, a connection tool 114, an automated test equipment (ATE) tool 116, a singulation tool 118, and a transport tool 120. The semiconductor processing tools 102-118 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV (EUV) light source, and/or the like), an x-ray source, an electron beam source, and/or another type of radiation source. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The etch tool 106 is a semiconductor processing tool that is capable of etching various types of materials of a substrate, wafer, or semiconductor device. For example, the etch tool 106 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The bonding tool 108 is a semiconductor processing tool that is capable of bonding two or more wafers (or two or more semiconductor substrates, or two or more semiconductor devices) together. For example, the bonding tool 108 may include a eutectic bonding tool that is capable of forming a eutectic bond between two or more wafers. In these examples, the bonding tool 108 may heat the two or more wafers to form a eutectic system between the materials of the two or more wafers.

The dispense tool 110 may dispense one or more materials during fabrication of a semiconductor device. For example, the dispense tool 110 may include a pressurized jet nozzle that dispenses a polymer material between beveled edges of semiconductor substrates (e.g., wafers) as part of a multi semiconductor substrate stacking process.

The planarization tool 112 is a semiconductor processing tool that is capable of polishing or planarizing various layers of a wafer or semiconductor device. For example, the planarization tool 112 may include a chemical mechanical planarization (CMP) tool and/or another type of planarization tool that polishes or planarizes a layer or surface of deposited or plated material. The planarization tool may polish or planarize a surface of a semiconductor device with a combination of chemical and mechanical forces (e.g., chemical etching and free abrasive polishing). The planarization tool 112 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The connection tool 114 is a semiconductor processing tool that is capable of forming connection structures (e.g., electrically-conductive structures). The connection structures formed by the connection tool 114 may include a wire, a stud, a pillar, a bump, or a solder ball, among other examples. The connection structures formed by the connection tool 114 may include materials such as a gold (Au) material, a copper (Cu) material, a silver (Ag) material, a nickel (Ni) material, a tin (Sn) material, or a palladium (Pd) material, among other examples. The connection tool 114 may include a bumping tool, a wire-bond tool, or a plating tool, among other examples.

The ATE tool 116 is a semiconductor processing tool that is capable of testing a quality and a reliability of one or more integrated circuit dies and/or a semiconductor package (e.g., the one or more integrated circuit dies after encapsulation). The ATE tool 116 may perform wafer testing operations, known good die (KGD) testing operations, and/or semiconductor die package testing operations, among other examples. The ATE tool 116 may include a parametric tester tool, a speed tester tool, and/or a burn-in tool, among other examples. Additionally, or alternatively, the ATE tool 116 may include a prober tool and/or probe card tooling, among other examples.

The singulation tool 118 is a semiconductor processing tool that is capable of singulating (e.g., separating, removing) one or more integrated circuit dies from a wafer. For example, the singulation tool 118 may include a dicing tool, a sawing tool, and/or or a laser tool that cuts the one or more integrated circuit dies from the wafer, among other examples.

The transport tool 120 is a semiconductor processing tool capable of transporting work-in-process (WIP) between the semiconductor processing tools 102-118. The transport tool 120 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool 120 may also be configured to transfer and/or combine WIP amongst transport carriers. The transport tool 120 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool 120.

As described in greater detail in connection with FIGS. 2-10 and elsewhere herein, one or more of the semiconductor processing tools 102-118 and/or the transport tool 120 may perform a series of manufacturing operations related to a supporting sealant structure for a stacked die application. For example, the series of operations includes forming a layer of a siloxane-based compound across a first semiconductor substrate. The series of operations includes forming a first bonding layer over the layer of a siloxane-based compound. The series of operations includes joining the first bonding layer to a second bonding layer that is associated with a second semiconductor substrate.

Additionally, or alternatively, the series of manufacturing operations includes forming a first layer of a silazane-based compound over a portion of a first integrated circuit die. The method includes forming a first dielectric layer over the first layer of the silzane-based compound. The series of manufacturing operations includes forming a second layer of the silazane-based compound over a portion of a second integrated circuit die. The series of manufacturing operations includes forming a second dielectric layer over the second layer of the silazane-based compound. The series of manufacturing operations includes joining the first dielectric layer and the second dielectric layer.

The number and arrangement of semiconductor processing tools shown in FIG. 1 are provided as one or more examples. In practice, there may be additional semiconductor processing tools, different semiconductor processing tools, or differently arranged semiconductor processing tools than those shown in FIG. 1. Furthermore, two or more semiconductor processing tools shown in FIG. 1 may be implemented within a single tool set, or a tool set shown in FIG. 1 may be implemented as multiple, distributed semiconductor processing tools. Additionally, or alternatively, one or more semiconductor processing tools of environment 100 may perform one or more functions described as being performed by another tool set of environment 100.

Figure 2:
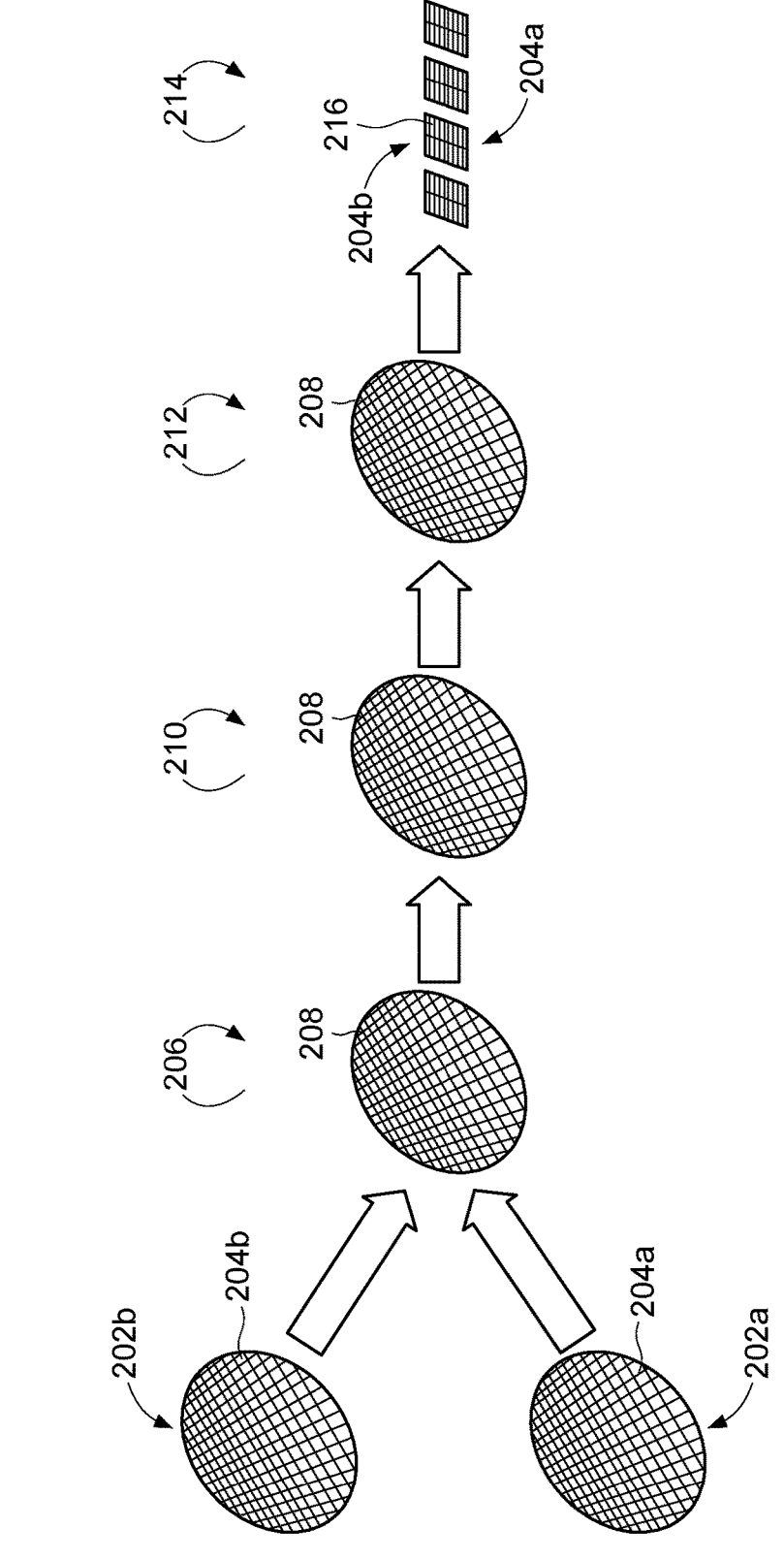
FIG. 2 is a diagram of an example implementation of formation of a stacked die product described herein.

FIG. 2 is a diagram of an example implementation 200 of formation of a stacked die product described herein. The implementation 200 may correspond to a "Wafer-on-Wafer" (WoW) technique used to form a three-dimensional integrated circuit die (3DIC) product, among other examples. The example implementation 200 may use one or more semiconductor processing tools 102-118 and/or the transport tool 120 of FIG. 1 to form the stacked die product.

As shown, a semiconductor substrate 202a may include an integrated circuit die 204a and a semiconductor substrate 202b may include an integrated circuit die 204b. The integrated circuit dies 204a and 204b may be formed using a series of deposition operations by the deposition tool 102, a series of patterning operations by the exposure tool 104, and a series of etch operations by the etch tool 106, among other examples.

A bonding operation 206 (e.g., a bonding operation by the bonding tool 108, among other examples) may align the integrated circuit dies 204a and 204b and bond the semiconductor substrates 202a and 202b to form a stack of semiconductor substrates 208. As a result of the bonding operation 206, integrated circuity of the integrated circuit dies 204a and 204b may be electrically connected for signaling purposes (e.g., inputs/output signaling, clocking or timing signaling, and/or power signaling, among other examples). The bonding operation 206 may include a eutectic bonding operation, a hybrid bonding operation, and/or another type of bonding operation.

To conserve space in a final semiconductor die package, a thinning operation 210 (e.g., a thinning operation by the planarization tool 112) may be performed to a top substrate of the stack of semiconductor substrates 208 (e.g., the semiconductor substrate 202a including the integrated circuit die 204a). In some implementations, and as described in greater detail in connection with FIGS. 3-10 and elsewhere herein, a supporting sealant structure may be formed on semiconductor substrate 202a and the semiconductor substrate 202b prior to the bonding operation 210. The supporting sealant structure may improve a robustness of the stack of semiconductor substrates 208 during the thinning operation 210 and/or subsequent operations performed to the stack of semiconductor substrates 208. For example, and by improving the robustness of the stack of semiconductor substrates, a likelihood of defects and/or yield loss within the stack of semiconductor substrates 208 due to trim-loss, trim wall exposure, and/or trim peeling that is inherent to a trimming operation may be reduced. Additionally, or alternatively and in some implementations, such a trimming operation is eliminated.

A bumping operation 212 (e.g., a bumping operation by the connection tool 114, among other examples) may form connection structures (e.g., solder balls, among other examples) on pads of integrated circuit dies of a top semiconductor substrate (e.g., the integrated circuit die 204a of the semiconductor substrate 202a). Such connection structures may be used for a testing operation and/or a packaging operation that encapsulates a stacked die product from the stack of semiconductor substrates 208.

A downstream series of operations 214 may include a testing operation and a dicing operation to test a stacked die product 216 (e.g., the integrated circuit die 204a joined to the integrated circuit die 204b) and extract the stacked die product 216 from the stack of semiconductor substrates. The testing operation (e.g., a testing operation by the ATE tool 116, among other examples) may ensure a quality of the bonding operation 210 and/or a quality of the integrated circuit dies included in the stack of semiconductor substrates 208 (e.g., the integrated circuit die 202a and/or the integrated circuit die 204b, among other examples). The testing operation may include a functionality test, a parametric test, and/or a reliability test, among other examples. The dicing operation to extract the stacked die product 216 from the stack of semiconductor substrates 208 may be performed by the singulation tool 118, among other examples.

As indicated above, FIG. 2 is provided as an example. Other examples may differ from what is described with regard to FIG. 2.

Figure 3:
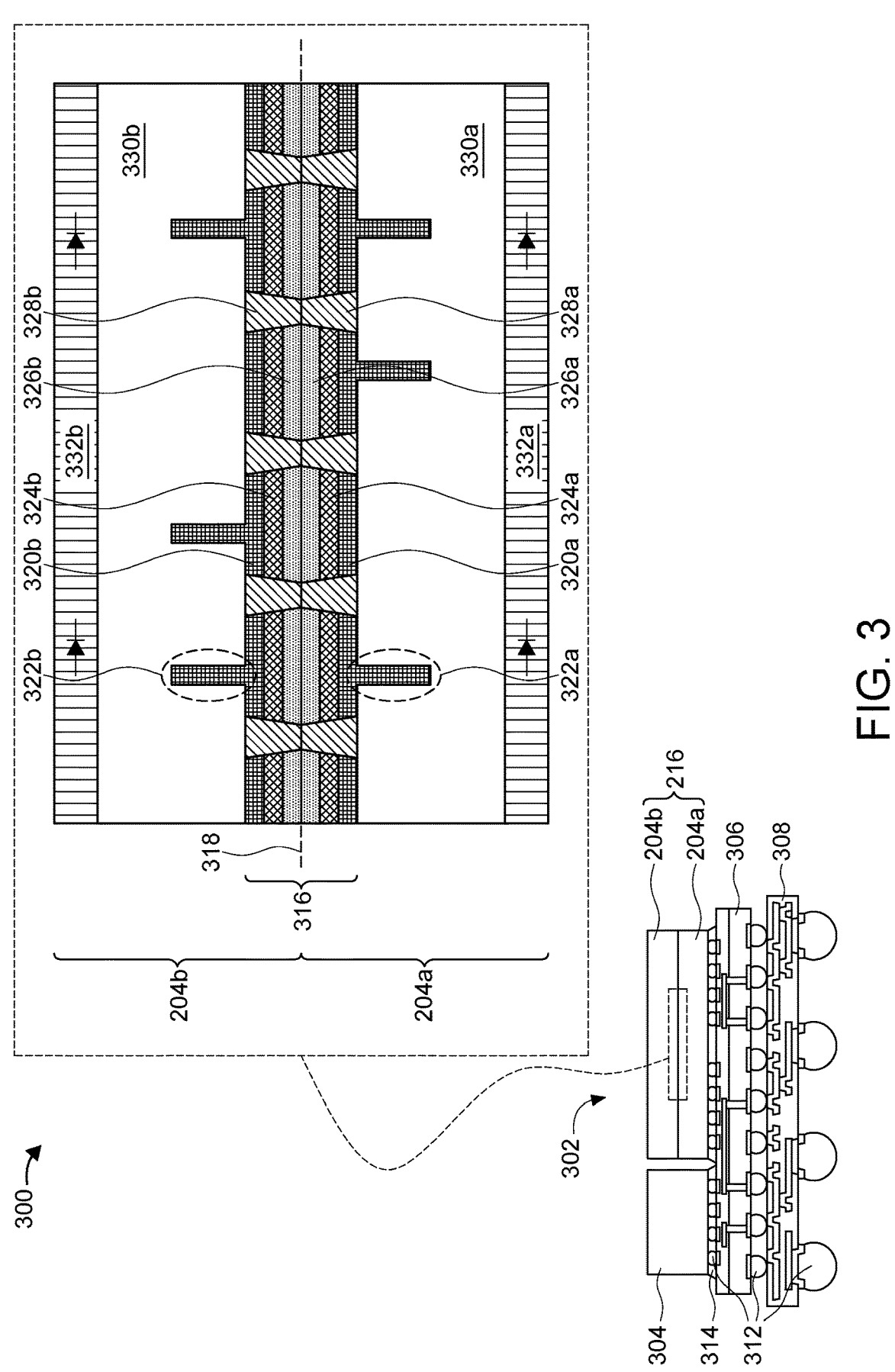
FIG. 3 is a diagram of an implementation of an example semiconductor die package including a stacked die product described herein.

FIG. 3 is a diagram of an implementation 300 of an example semiconductor die package 302 including a stacked die product described herein. The semiconductor die package 302 includes the stacked die product 216 (e.g., the integrated circuit die 204a joined with the integrated circuit die 204b) and an integrated circuit die 304. As examples, the integrated circuit die 204a may correspond to a first system on chip (SoC) integrated circuit die and the integrated circuit die 204b may correspond to a second SoC integrated circuit die. Additionally, or alternatively, the integrated circuit die 304 may correspond to a high bandwidth memory (HBM) die, such as a dynamic random access memory (DRAM) IC die.

The semiconductor die package 302 may include an interposer 306 having one or more layers of electrically-conductive traces. The electrically-conductive traces of the interposer 306 may include one or more materials such as a gold (Au) material, a copper (Cu) material, a silver (Ag) material, a nickel (Ni) material, a tin (Sn) material, or a palladium (Pd) material, among other examples. The interposer 306 may further include one or more layers of a dielectric material, such as a ceramic material or a silicon material, among other examples. In some implementations, the interposer 306 corresponds to a PCB including layers of a glass-reinforced epoxy laminate material and/or a pre-preg material (e.g., a composite fiber/resin/epoxy material), among other examples. Additionally, or alternatively, one or more layers of the interposer 306 may include a buildup film material.

The semiconductor die package 302 may further include a substrate 308 having one or more layers of electrically-conductive traces. The electrically-conductive traces of the substrate 308 may include one or more materials such as a gold (Au) material, a copper (Cu) material, a silver (Ag) material, a nickel (Ni) material, a tin (Sn) material, or a palladium (Pd) material, among other examples. The substrate 308 may further include one or more layers of a dielectric material, such as a ceramic material or a silicon material, among other examples. In some implementations, the substrate corresponds to a PCB including layers of a glass-reinforced epoxy laminate material and/or a pre-preg material (e.g., a composite fiber/resin/epoxy material), among other examples. Additionally, or alternatively, one or more layers of the substrate 308 may include a buildup film material.

The semiconductor die package 302 may further include connection structures 312. Examples of the connection structures 312 include a stud, a pillar, a bump, and/or a solder ball. The connection structures 312 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

A portion of the connection structures 312 may connect the stacked die product 216 and/or the integrated circuit die 304 with the interposer (e.g., the stacked die product 216 and/or the integrated circuit die 304 are attached to the interposer 306 using one or more of the connection structures 312). Additionally, or alternatively, another portion of the connection structures 312 may connect the interposer with the substrate 308. Additionally, or alternatively, another portion of the connection structures 312 may be included to connect the substrate to a system level PCB. In some implementations, the connection structures 312 provide one or more electrical connections for transmitting and/or exchanging signals within the semiconductor die package 302. Additionally, or alternatively and in some implementations, the connection structures 312 provide one or more mechanical connections for attachment purposes and/or spacing purposes). Additionally, or alternatively and in some implementations, one or more of the connection structures 312 provide both electrical and mechanical connections.

As shown in the detailed, magnified view of implementation 300, the stacked die product 216 includes a bond interface structure 316. The bond interface structure 316 joins the integrated circuit die 204a with the integrated circuit die 204b along a bond interface 318.

In some implementations and as shown, the bond interface structure 316 includes a sealant layer 320a and a sealant layer 320b. The sealant layer 320a may be included as part of (e.g., on, over, or associated with) the integrated circuit die 204a, and the sealant layer 320b may be included as part of (e.g., on, under, or associated with) the integrated circuit die 204b.

The sealant layers 320a and 320b may include a siloxane-based or silazane-based compound. Examples of compounds which may be included in the sealant layers 320a and 320b include dimethyldiethoxysilane (DMDEOS) compounds, tetraethyl orthosilicate (TEOS) compounds, polydimethyl-siloxane (PDMS), and/or polysilazanes (PHPS) compounds. In some implementations, a physical property (e.g., an elasticity, a hardness) of the compounds may provide a degree of compliance within the bond interface structure 316 that reduces a likelihood of warping of the integrated circuit dies 204a and/or 204b.

Additionally, or alternatively, the sealant layer 320a and/or the sealant layer 320b may include composite filler particulates. Examples of composite filler particulates include silicon carbide (SiC) composite filler particulates, aluminum dioxide ($Al_2O_3$) composite filler particulates, zirconium tungsten phosphate ($Zr_2WP_2O_{12}$ or ZWP) composite filler particulates, silica ($SiO_2$) composite filler particulates, and/or ceramic composite particulates. Such composite particulates may strengthen the sealant layers 320a and/or 320b to reduce a likelihood of a tearing and/or a peeling of the sealant layer 320a and/or 320b during a thinning operation that thins the integrated circuit die 204a and/or the integrated circuit die 204b.

In some implementations, and as further shown in the magnified view of FIG. 3, the integrated circuit die 204a includes a stress-relief structure 322a that is filled with a portion of the sealant layer 320a. Additionally, or alternatively and in some implementations, the integrated circuit die 204b includes a stress-relief structure 322b that is filled with a portion of the sealant layer 320b. The stress-relief structures 322a and/or 322b may relieve lateral stresses proximate to, or within, the bond interface structure 316 to reduce a likelihood of warping of the integrated circuit dies 204a and/or 204b.

In some implementations, and as further shown, the bond interface structure 316 includes a dielectric layer 324a and a dielectric layer 324b. The dielectric layer 324a may be included as part of (e.g., on, over, or associated with) the integrated circuit die 204a, and the dielectric layer 324b may be included as part of (e.g., on, under, or associated with) the integrated circuit die 204b. Further, and in some implementations, the dielectric layers 324a and/or 324b are referred to as passivation layers.

The dielectric layers 324a and 324b may include a dielectric material. Examples of dielectric materials which may be included in the dielectric layers 324a and 324b include a silicon dioxide ($SiO_2$) material, a silicon oxycarbide (SiOC) material, an aluminum dioxide ($Al_2O_3$) material, an undoped silicon glass material, and/or a phospho-silicate glass material. In some implementations, the dielectric layers 324a and 324b protect the integrated circuit dies 204a and/or 204b from damage during an operation that joins the integrated circuit dies 204a and/or 204b.

In some implementations, and as further shown, the bond interface structure 316 includes a bonding layer 326a and a bonding layer 326b. The bonding layer 326a may be included as part of (e.g., on, over, or associated with) the integrated circuit die 204a, and the bonding layer 326b may be included as part of (e.g., on, under, or associated with) the integrated circuit die 204b.

The bonding layers 326a and 326b may include a silicon onxynitride (SiON) material. Additionally, or alternatively, the bonding layers 326a and/or 326b may include a silicon dioxide ($SiO_2$) material, a silicon oxycarbide (SiOC) material, an aluminum dioxide ($Al_2O_3$) material, an undoped silicon glass material, and/or a phosphosilicate glass material, among other examples. In some implementations, the bonding layers 326a and 326b partially couple (e.g., contribute to a bond) of the integrated circuit dies 202a and 202b along the bond interface 318.

In some implementations, and as further shown, the bond interface structure 316 includes a set of interconnect structures 328a and a set of interconnect structures 328b. The set of interconnect structures 328a may be included as part of (e.g., on, over, or associated with) the integrated circuit die 204a, and the set of interconnect structures 328b may be included as part of (e.g., on, under, or associated with) the integrated circuit die 204b. In some implementations, the set of interconnect structures 328a is interspersed through the bonding layer 326a and the sealant layer 320a. In some implementations, the set of interconnect structures is interspersed through the bonding layer 326b and the sealant layer 320b.

The sets of interconnect structures 328a and/or 328b may include a copper (Cu) material. Additionally, or alternatively, the sets of interconnect structures 328a and/or 328b may include a gold (Au) material, a silver (Ag) material, a nickel (Ni) material, or a tin (Sn) material, among other examples. In some implementations, the sets of interconnect structures 328a and/or 328b partially couple (e.g., contribute a bond between) the integrated circuit dies 202a and 202b along the bond interface 318.

In some implementations, and as shown in FIG. 3, the integrated circuit device 204a includes a substrate layer 330a (a layer of a silicon (Si) material, among other examples). One or more portions of the bond interface structure 316 (e.g., the sealant layer 320a, the dielectric layer 324a, the bonding layer 326a, and/or the set of interconnect structures 328a) may intervene between the substrate layer 330a and the bond interface 318. In some implementations, integrated circuitry 332a may be associated with (e.g., on or within) the integrated circuit device 204a, where the substrate layer 330a intervenes between integrated circuitry 332a and the bond interface structure 316.

In some implementations, and as shown in FIG. 3, the integrated circuit die 204b includes a substrate layer 330b (a layer of a silicon (Si) material, among other examples). One or more portions of the bond interface structure 316 (e.g., the sealant layer 320b, the dielectric layer 324b, the bonding layer 326b, and/or the set of interconnect structures 328b) may intervene between the substrate layer 330b and the bond interface 318. In some implementations, integrated circuitry 332b may associated with (e.g., on or within) with the integrated circuit die 204b, where the substrate layer 330b intervenes between the integrated circuitry 332b and the bond interface structure 316.

As shown in FIG. 3, a device (e.g., the stacked die product 216) includes a first bonding layer (e.g., the bonding layer 326a). The device further includes a first layer of a siloxane-based compound or a silazane-based compound (e.g., the sealant layer 320a) between the first bonding layer and first integrated circuitry (e.g., the integrated circuitry 332a), where the first integrated circuitry is associated with a first integrated circuit die (e.g., the integrated circuit die 204a). The device includes a second bonding layer (e.g., the bonding layer 326b) joined with the first bonding layer. The device includes a second layer of a siloxane-based compound or a silazane-based compound (e.g., the sealant layer 320b) between the second bonding layer and second integrated circuitry (e.g., the integrated circuitry 332b), where the second integrated circuitry is associated with a second semiconductor die (e.g., the integrated circuit die 204b).

Using the bond interface structure 316, a yield of the stacked die product 216 is increased relative to a yield of a stacked die product formed using a bond interface structure that does not include the sealant layers 320a and/or 320b. By increasing the yield of the stacked die product 216, a consumption of resources for manufacturing a volume of the stacked die product 216 (e.g., semiconductor manufacturing processing tools, raw materials, manpower, and/or computing resources) may be reduced.

The number and arrangement of structures and layers shown in FIG. 3 are provided as one or more examples. In practice, there may be additional structures and layers, different structures and layers, or differently arranged structures and layers than those shown in FIG. 3.

Figure 4A:
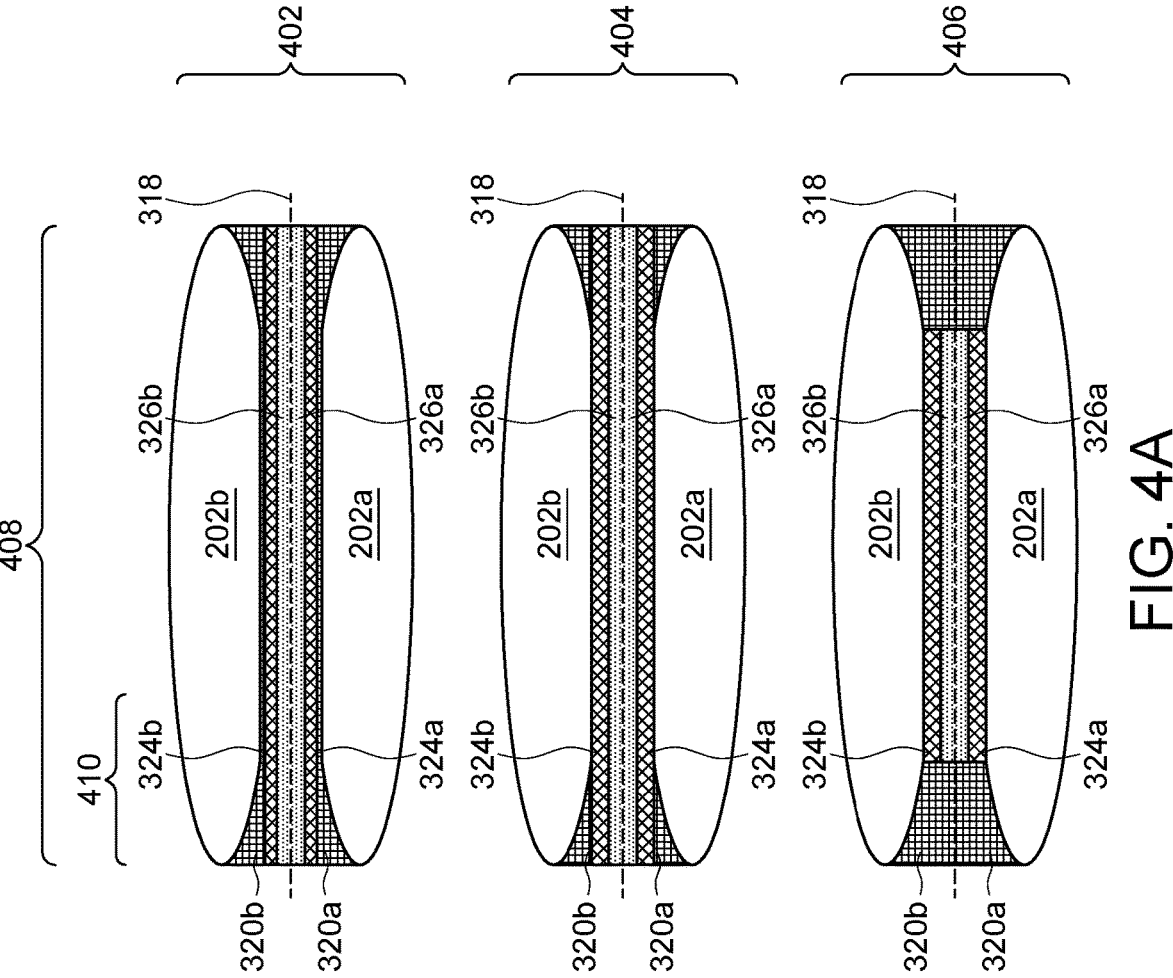
FIGS. 4A-4C are diagrams of example implementations of example semiconductor substrate based supporting layered structures including sealant layers described herein.
Figure 4A:
Figure 4B:
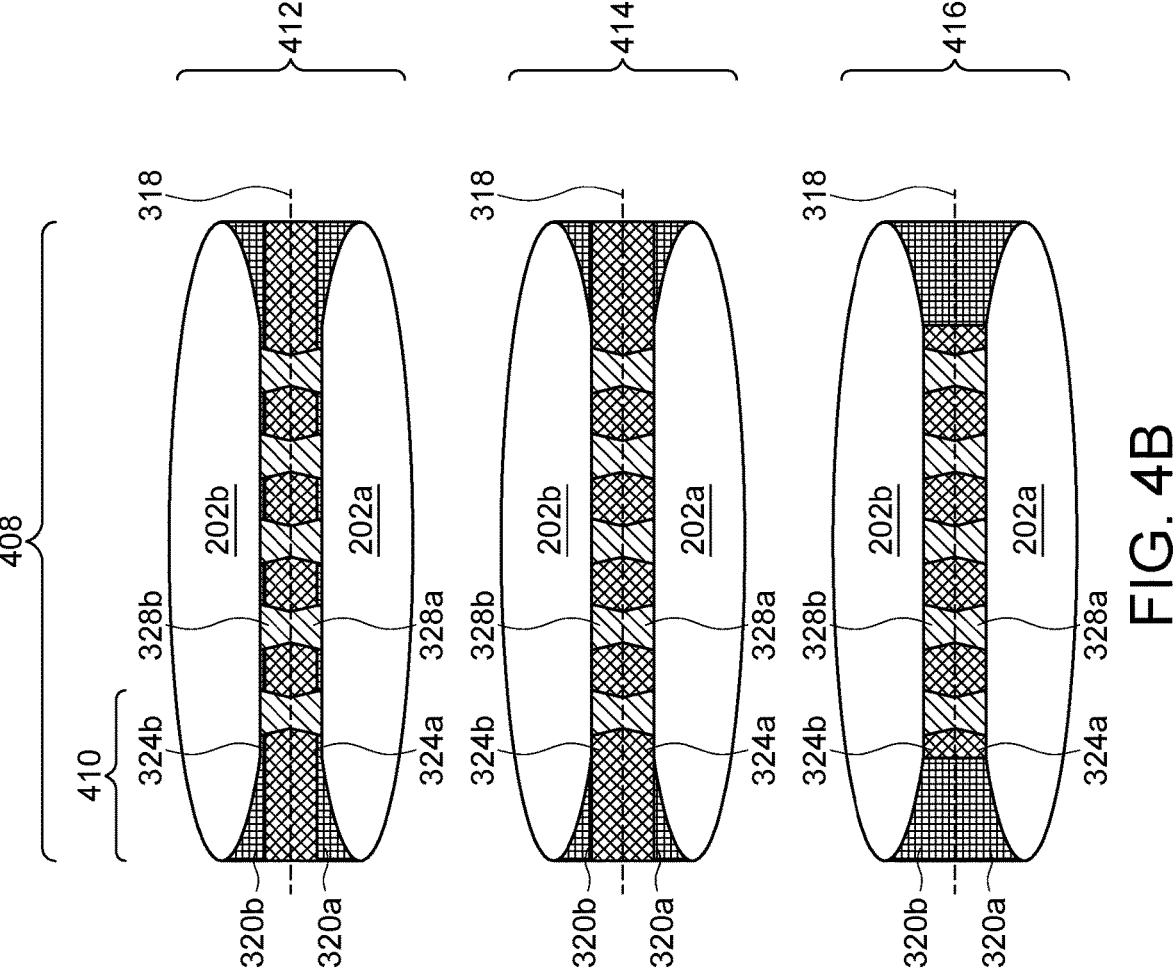
Figure 4B:
Figure 4C:
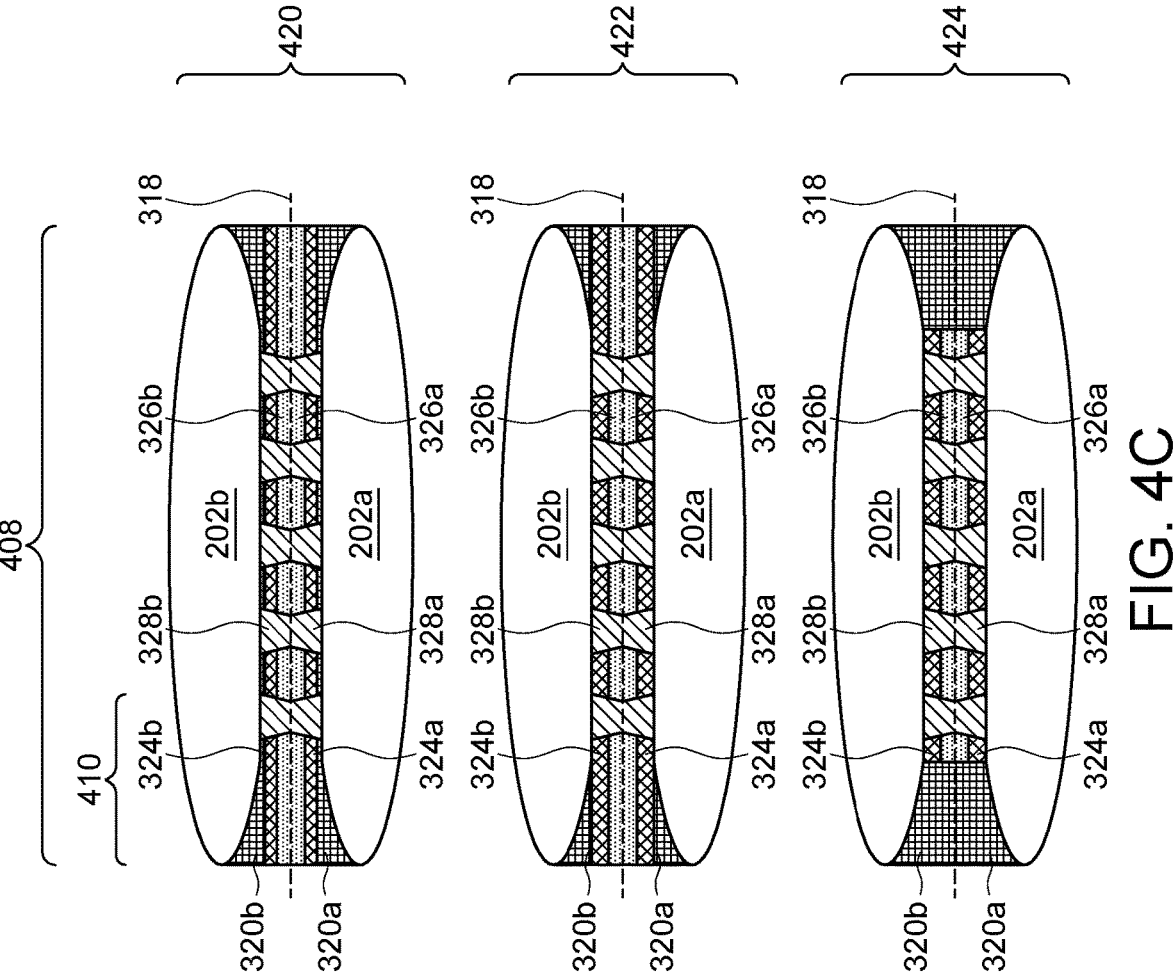
Figure 4C:

FIGS. 4A-4C are diagrams of example implementations 400 of example semiconductor substrate based layered structures including sealant layers described herein. The semiconductor substrate based layered structures may include the sealant layers 320a and 320b and the semiconductor substrates 202a and 202b joined along the bond interface 318.

FIG. 4A shows examples of semiconductor substrate based layered structures including the sealant layers 320a and 320b, the dielectric layers 324a and 324b, and the bonding layers 326a and 326b. FIG. 4A includes examples 402, 404, and 406 in relation to an entire width 408 of the semiconductor substrates 202a and 202b and in relation to beveled regions 410 (e.g., beveled perimeter regions) between the semiconductor substrates 202a and 202b.

As shown in example 402, the bond interface 318 is across the entire width 408 of the semiconductor substrates 202a and 202b. Further, and as shown in example 402, the sealant layers 320a and 320b are across the entire width 408 of the semiconductor substrates 202a and 202b. In some implementations, the semiconductor substrate based layered structure of example 402 is referred to as an "under bond interface" layered structure. In such implementations, one or more layers of a bond interface structure may be located (e.g., intervene) between the sealant layers 320a and 320b across the entire width 408.

As shown in example 404, the bond interface 318 is across the entire width 408 of the semiconductor substrates 202a and 202b. Further, and as shown in example 404, the sealant layers 320a and 320b are contained within the beveled regions 410 of the semiconductor substrates 202a and 202b (e.g., not across the entire width 408). In some implementations, the semiconductor substrate based layered structure of example 404 is referred to as a "bevel supporting under bond interface" layered structure. In such implementations, one or more layers of a bond interface structure may be located between the sealant layers 320a and 320b within the beveled regions 410.

As shown in example 406, the bond interface 318 is across a portion of the entire width 408 of the semiconductor substrates 202a and 202b (e.g., the bond interface 318 is excluded from the beveled regions 410). Further, and as shown in example 406, the sealant layers 320a and 320b join within the beveled regions 410 of the semiconductor substrates 202a and 202b (e.g., there are no intervening layers between the sealant layers 320a and 320b). In some implementations, the semiconductor substrate based layered structure of example 406 is referred to as a "bevel supporting only" layered structure.

In the example 406, and in some implementations, the dielectric layers 324a and 324 are formed over and/or on the semiconductor substrates 202a and 202b using a deposition operation. The deposition tool 102 may deposit the dielectric layers 324a and 324 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the dielectric layers 324a and 324 after the deposition tool 102 deposits the dielectric layers 324a and 324.

In example 406, the bonding layers 326a and 326b may be formed over and/or on the dielectric layers 324a and 324. To form the bonding layers 326a and 326b, the deposition tool 102 may deposit the bonding layers 326a and 326b in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the bonding layers 326a and 326b after the deposition tool 102 deposits the bonding layers 326a and 326b.

In example 406, and after formation, the bonding layers 326a and 326b may be joined. To join the bonding layers 326a and 326b, the bonding tool 108 may perform a eutectic bonding operation, another type of bonding operation described in connection with FIG. 1, and/or another bonding operation that joins the bonding layers 326a and 326b along the bond interface 318.

After joining of the bonding layers 326a and 326b, a gap may exist in the beveled region 410. In such a case, the deposition tool 102 may deposit the sealant layers 320a and 320b in the beveled regions 410 to fill the gap. The deposition tool 102 may deposit the sealant layers 320a and/or 320b in a dispense operation, a PVD operation, an ALD operation, a CVD operation, an epitaxy operation, an oxidation operation, another type of deposition operation described in connection with FIG. 1, and/or another suitable deposition operation.

FIG. 4B shows examples of semiconductor substrate layered structures including the sealant layers 320a and 320b, the dielectric layers 324a and 324b, and the sets of interconnect structures 328a and 328b. In FIG. 4B, the bond interface 318 joins the dielectric layers 324a and 324b. Further, and as shown in FIG. 4B, the bond interface 318 joins the interconnect structures 328a and 328b.

As shown in example 412, the bond interface 318 is across the entire width 408 of the semiconductor substrates 202a and 202b. Further, and as shown in example 412, the sealant layers 320a and 320b are across the entire width 408 of the semiconductor substrates 202a and 202b. In some implementations, the semiconductor substrate based layered structure of example 412 is referred to as an "under bond interface" layered structure. In such implementations, one or more layers of a bond interface structure may be located between the sealant layers 320a and 320b across the entire width 408.

As shown in example 414, the bond interface 318 is across the entire width 408 of the semiconductor substrates 202a and 202b. Further, and as shown in example 414, the sealant layers 320a and 320b are contained within the beveled regions 410 of the semiconductor substrates 202a and 202b (e.g., not across the entire width 408). In some implementations, the semiconductor substrate based layered structure of example 414 is referred to as a "bevel supporting under bond interface" layered structure. In such implementations, one or more layers of a bond interface structure may be located between the sealant layers 320a and 320b within the beveled regions 410.

As shown in example 416, the bond interface 318 is across a portion of the entire width 408 of the semiconductor substrates 202a and 202b (e.g., the bond interface 318 is excluded from the beveled regions 410). Further, and as shown in example 416, the sealant layers 320a and 320b join within the beveled regions 410 (e.g., there are no intervening layers of a bond interface structure between the sealant layers 320a and 320b). In some implementations, the semiconductor substrate based layered structure of example 416 is referred to as a "bevel supporting only" layered structure.

FIG. 4C shows examples of semiconductor substrate layered structures including the sealant layers 320a and 320b, the dielectric layers 324a and 324b, the bonding layers 326a and 326b, and the sets of interconnect structures 328a and 328b. In FIG. 4C, the bond interface 318 joins the bonding layers 326a and 326b. Further, and as shown in FIG. 4C, the bond interface 318 joins the interconnect structures 328a and 328b.

As shown in example 420, the bond interface 318 is across the entire width 408 of the semiconductor substrates 202a and 202b. Further, and as shown in example 420, the sealant layers 320a and 320b are across the entire width 408 of the semiconductor substrates 202a and 202b. In some implementations, the semiconductor substrate based layered structure of example 420 is referred to as an "under bond interface" layered structure. In such implementations, one or more layers of a bond interface structure may be located between the sealant layers 320a and 320b across the entire width 408.

As shown in example 422, the bond interface 318 is across the entire width 408 of the semiconductor substrates 202a and 202b. Further, and as shown in example 422, the sealant layers 320a and 320b are contained within the beveled regions 410 of the semiconductor substrates 202a and 202b (e.g., not across the entire width 408). In some implementations, the semiconductor substrate based layered structure of example 422 is referred to as a "bevel supporting under bond interface" layered structure.

As shown in example 424, the bond interface 318 is across a portion of the entire width 408 of the semiconductor substrates 202a and 202b (e.g., the bond interface 318 is excluded from the beveled regions 410). Further, and as shown in example 424, the sealant layers 320a and 320b join within the beveled regions 410 of the semiconductor substrates 202a and 202b (e.g., there are no intervening layers between the sealant layers 320a and 320b). In some implementations, the semiconductor substrate based layered structure of example 424 is referred to as a "bevel supporting only" layered structure.

As indicated above, FIGS. 4A-4C are provided as examples. Other examples may differ from what is described with regard to FIGS. 4A-4C.

Figure 5A:
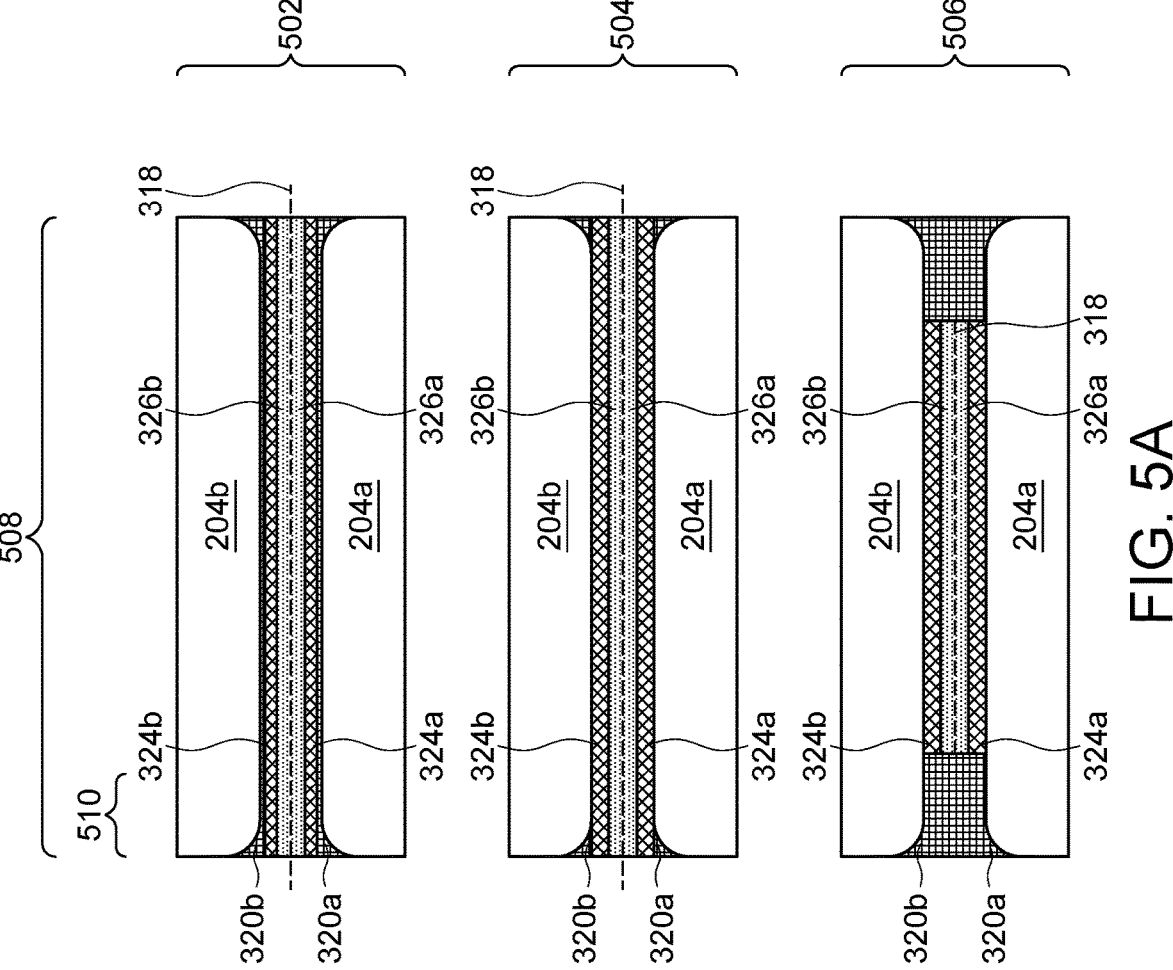
FIGS. 5A-5C are diagrams of example implementations of example semiconductor die based supporting layered structures including a sealant layer described herein.
Figure 5B:
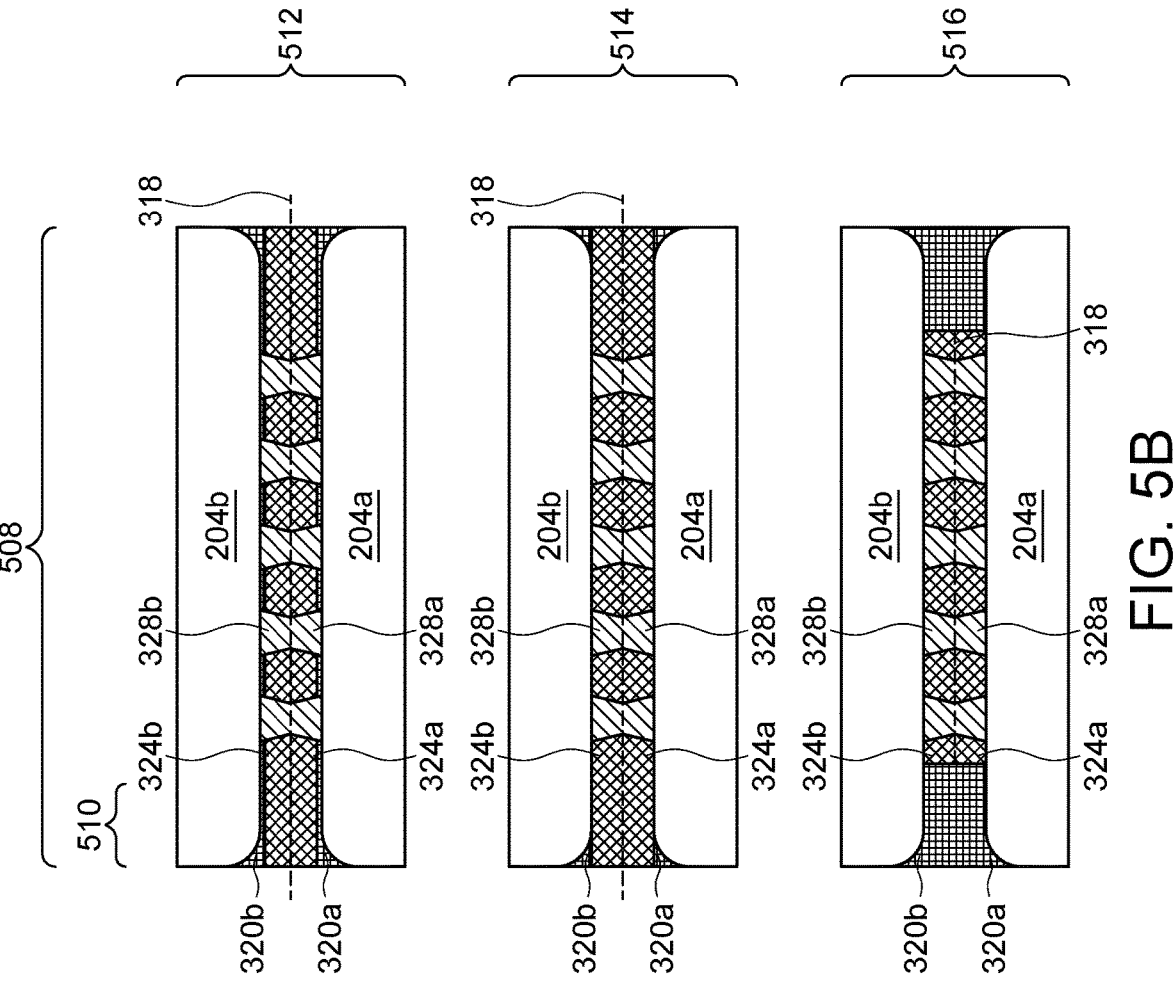
Figure 5C:
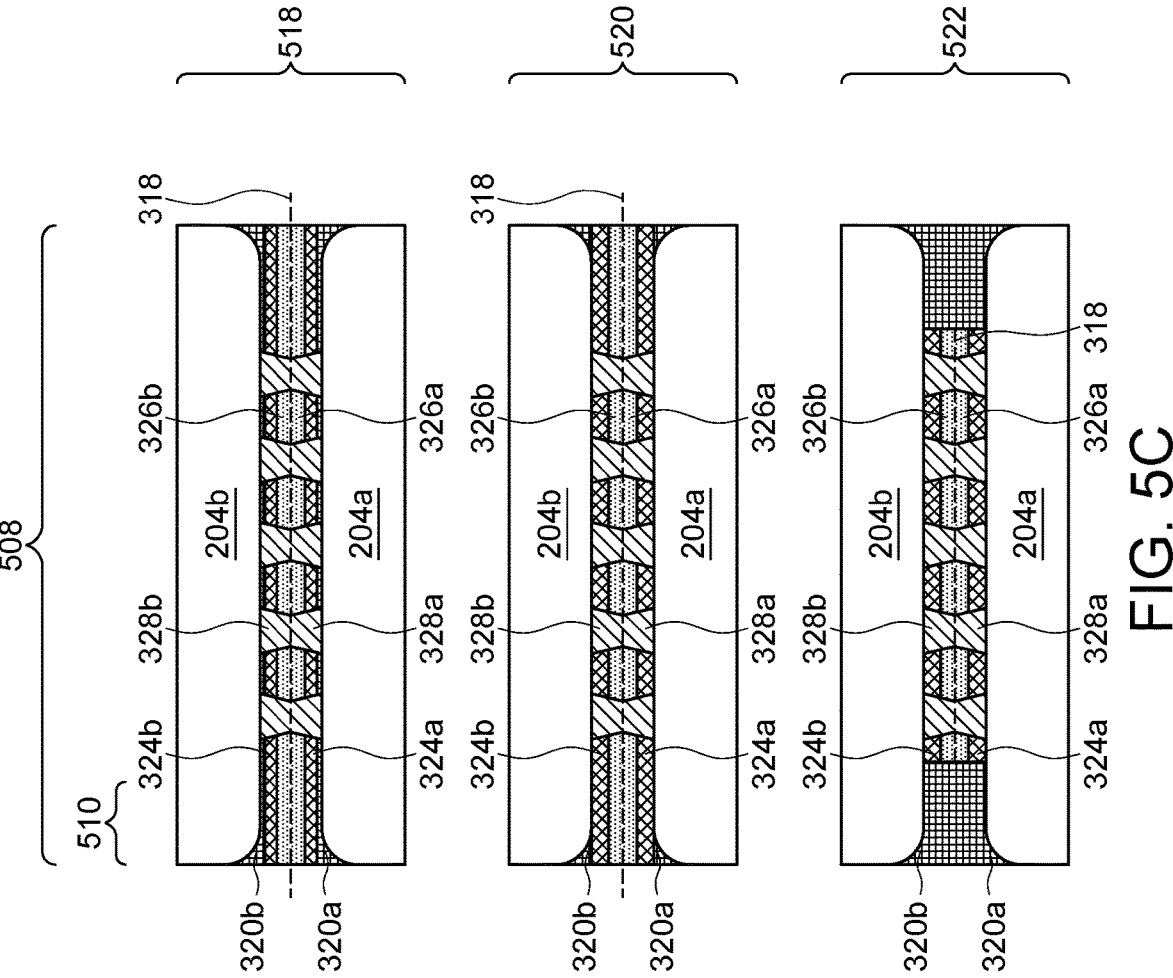

FIGS. 5A-5C are diagrams of example implementations 500 of example integrated circuit die based layered structures including sealant layers described herein. The integrated circuit die based layered structures may include the sealant layers 320a and 320b and the integrated circuit dies 204a and 204b joined along the bond interface 318.

FIG. 5A shows examples of integrated circuit die based layered structures including the sealant layers 320a and 320b, the dielectric layers 324a and 324b, and the bonding layers 326a and 326b. FIG. 5A includes examples 502, 504, and 506 in relation to an entire width 508 of the integrated circuit dies 204a and 204b and in relation to beveled regions 510 (e.g., beveled edge regions) between the integrated circuit dies 204a and 204b.

As shown in example 502, the bond interface 318 is across the entire width 508 of the integrated circuit dies 204a and 204b. Further, and as shown in example 502, the sealant layers 320a and 320b are across the entire width 508 of the integrated circuit dies 204a and 204b. In some implementations, the integrated circuit die based layered structure of example 502 is referred to as an "under bond interface" layered structure. In such implementations, one or more layers of a bond interface structure may be located between the sealant layers 320a and 320b across the entire width 508.

As shown in example 504, the bond interface 318 is across the entire width 508 of the integrated circuit dies 204a and 204b. Further, and as shown in example 504, the sealant layers 320a and 320b are contained within the beveled regions 510 of the integrated circuit dies 204a and 204b (e.g., not across the entire width 508). In some implementations, the integrated circuit die based layered structure of example 504 is referred to as a "bevel supporting under bond interface" layered structure. In such implementations, one or more layers of a bond interface structure may be located between the sealant layers 320a and 320b within the beveled regions 510.

As shown in example 506, the bond interface 318 is across a portion of the entire width 508 of the integrated circuit dies 204a and 204b (e.g., the bond interface 318 is excluded from the beveled regions 510). Further, and as shown in example 506, the sealant layers 320a and 320b join within the beveled regions 510 of the integrated circuit dies 204a and 204b (e.g., there are no intervening layers between the sealant layers 320a and 320b). In some implementations, the integrated circuit die based layered structure of example 506 is referred to as a "bevel supporting only" layered structure.

FIG. 5B shows examples of semiconductor substrate layered structures including the sealant layers 320a and 320b, the dielectric layers 324a and 324b, and the sets of interconnect structures 328a and 328b. In FIG. 5B, the bond interface 318 joins the dielectric layers 324a and 324b. Further, and as shown in FIG. 5B, the bond interface 318 joins the interconnect structures 328a and 328b.

As shown in example 512, the bond interface 318 is across the entire width 508 of the integrated circuit dies 204a and 204b. Further, and as shown in example 512, the sealant layers 320a and 320b are across the entire width 508 of the semiconductor dies 204a and 204b. In some implementations, the integrated circuit die based layered structure of example 512 is referred to as an "under bond interface" layered structure. In such implementations, one or more layers of a bond interface structure may be located between the sealant layers 320a and 320b across the entire width 508.

As shown in example 514, the bond interface 318 is across the entire width 508 of the integrated circuit dies 204a and 204b. Further, and as shown in example 514, the sealant layers 320a and 320b are contained within the beveled regions 510 of the integrated circuit dies 204a and 204b (e.g., not across the entire width 508). In some implementations, the integrated circuit die based layered structure of example 514 is referred to as a "bevel supporting under bond interface" layered structure. In such implementations, one or more layers of a bond interface structure may be located between the sealant layers 320a and 320b within the beveled regions 510.

As shown in example 516, the bond interface 318 is across a portion of the entire width 508 of the integrated circuit dies 204a and 204b (e.g., the bond interface 318 is excluded from the beveled regions 510). Further, and as shown in example 516, the sealant layers 320a and 320b join within the beveled regions 510 (e.g., there are no intervening layers between the sealant layers 320a and 320b). In some implementations, the integrated circuit die based layered structure of example 516 is referred to as a "bevel supporting only" layered structure.

FIG. 5C shows examples of semiconductor substrate layered structures including the sealant layers 320a and 320b, the dielectric layers 324a and 324b, the bonding layers 326a and 326b, and the sets of interconnect structures 328a and 328b. In FIG. 5C, the bond interface 318 joins the bonding layers 326a and 326b. Further, and as shown in FIG. 5C, the bond interface 318 joins the interconnect structures 328a and 328b.

As shown in example 518, the bond interface 318 is across the entire width 508 of the integrated circuit dies 204a and 204b. Further, and as shown in example 520, the sealant layers 320a and 320b are across the entire width 508 of the integrated circuit dies 204a and 204b. In some implementations, the integrated circuit die based layered structure of example 520 is referred to as an "under bond interface" layered structure. In such implementations, one or more layers of a bond interface structure may be located between the sealant layers 320a and 320b across the entire width 508.

As shown in example 520, the bond interface 318 is across the entire width 508 of the integrated circuit dies 204a and 204b. Further, and as shown in example 522, the sealant layers 320a and 320b are contained within the beveled regions 510 of the integrated circuit dies 204a and 204b (e.g., not across the entire width 508). In some implementations, the integrated circuit die based layered structure of example 522 is referred to as a "bevel supporting under bond interface" layered structure. In such implementations, one or more layers of a bond interface structure may be located between the sealant layers 320a and 320b within the beveled regions 510.

As shown in example 522, the bond interface 318 is across a portion of the entire width 508 of the integrated circuit dies 204a and 204b (e.g., the bond interface 318 is excluded from the beveled regions 510). Further, and as shown in example 524, the sealant layers 320a and 320b join within the beveled regions 510 of the integrated circuit dies 204a and 204b (e.g., there are no intervening layers between the sealant layers 320a and 320b). In some implementations, the integrated circuit die based layered structure of example 524 is referred to as a "bevel supporting only" layered structure.

As indicated above, FIGS. 5A-5C are provided as examples. Other examples may differ from what is described with regard to FIGS. 5A-5C.

Figure 6:
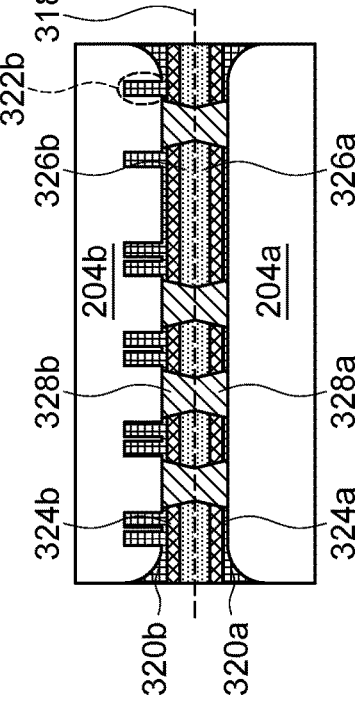
FIG. 6 is a diagram of an example implementation of an example stress-relief structure described herein.

FIG. 6 is a diagram of an example implementation 600 of an example stress-relief structure described herein. The stress-relief structure may correspond to the stress-relief structure 322b.

As shown in FIG. 6, the integrated circuit dies 204a and 204b are joined together using an integrated circuit die based layered structure corresponding to example 518 of FIG. 5C. In FIG. 6, the stress-relief structure 322b penetrates into the integrated circuit die 204b and includes a portion of the sealant layer 320b. In contrast, the integrated circuit die 204a of FIG. 6 does not include a stress-relief structure.

Selecting to include stress-relief structures in, or exclude stress-relief structures from, an integrated circuit die may be dependent on factors that include a projected stress profile along the bond interface 318, a projected warpage of a stacked die product including the integrated circuit dies 204a and 204b, and/or a property of one or more of materials included in the stacked die product, among other examples. Additionally, or alternatively, a degree of a stress-relief (and/or warpage of a stacked die structure including the integrated circuit dies 204a and 204b) may be modulated by adjusting a size, pattern, or spacing of the stress-relief structures 322b.

As indicated above, FIG. 6 is provided as an example. Other examples may differ from what is described with regard to FIG. 6.

FIGS. 7A-7F are diagrams of an example implementation 700 of forming a layered structure including a sealant layer described herein. In some implementations, one or more of the semiconductor processing tools 102-118 and/or the transport tool 120 may perform one or more of the operations described in connection with the example implementation 700. In some implementations, one or more operations described in connection with the example implementation 700 may be performed by another semiconductor processing tool. Further, and although the example implementation 700 is described in the context of forming the layered structure as part joining two semiconductor substrates, one or more aspects of the example implementation 700 may be applicable to forming the layered structure as part of joining two integrated circuit dies.

Figure 7A:
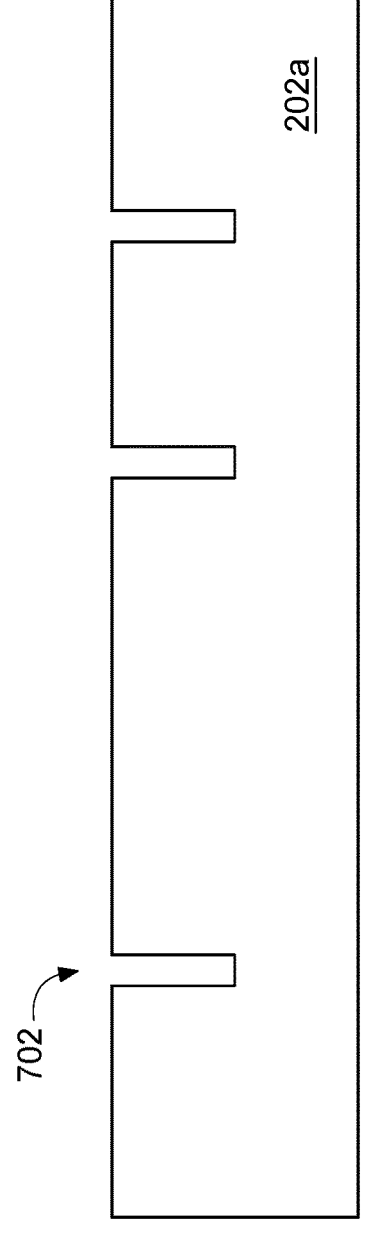
FIGS. 7A-7F are diagrams of an example implementation of forming a layered structure including a sealant layer described herein.

Turning to FIG. 7A, stress-relief cavities 702 may be formed in the semiconductor substrate 202a. For example, one or more of the semiconductor processing tools 102-118 may perform photolithography patterning operations, etching operations, CMP operations, and/or another type of operations to form the stress-relief cavities in the semiconductor substrate 202a.

Figure 7B:
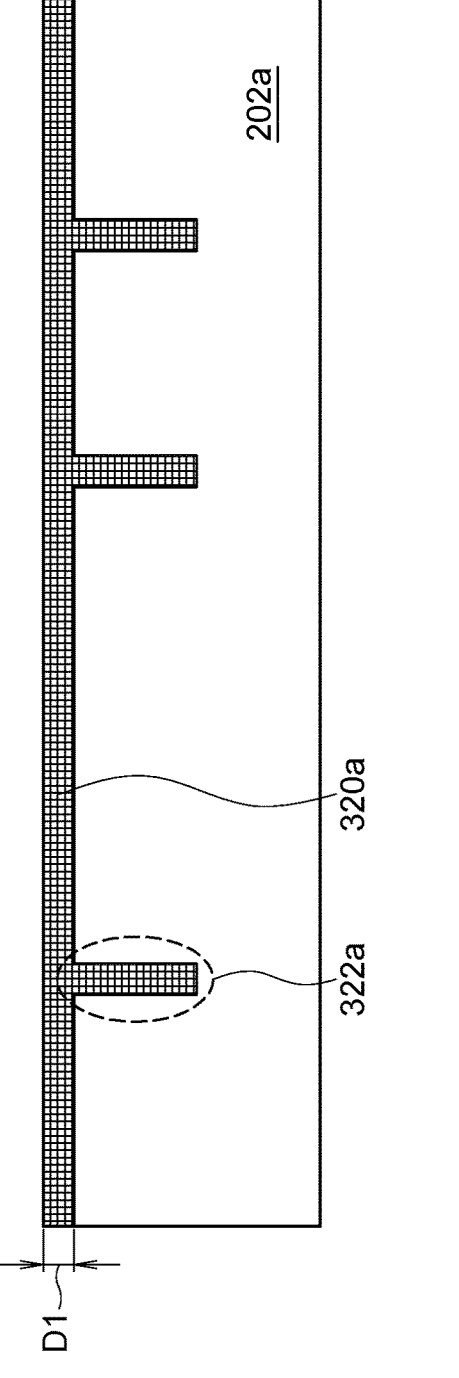

As shown in FIG. 7B, the sealant layer 320a may be formed over the semiconductor substrate 202a. For example, one or more of the semiconductor processing tools 102-114 may perform dispense operations, curing operations, CMP operations, and/or another type of operations to form the sealant layer 320a over the semiconductor substrate 202a. As part of forming the sealant layer 320a over the semiconductor substrate 202a, the stress-relief cavities 702 may be filled to form the stress-relief structure 322a.

In some implementations, and after formation, a thickness D1 of the sealant layer 320a may be included in a range of approximately 1 micron to approximately 20 microns. If the thickness D1 less than approximately 1 micron, a bond interface structure including the sealant layer 320a may have insufficient rigidity and/or strength to prevent warpage of the semiconductor substrate 202a during a subsequent bonding operation. If the thickness D1 is greater than approximately 20 microns, a cost increase and/or manufacturing inefficiencies may be introduced. However, other values and ranges for the thickness D1 are within the scope of the present disclosure.

Figure 7C:
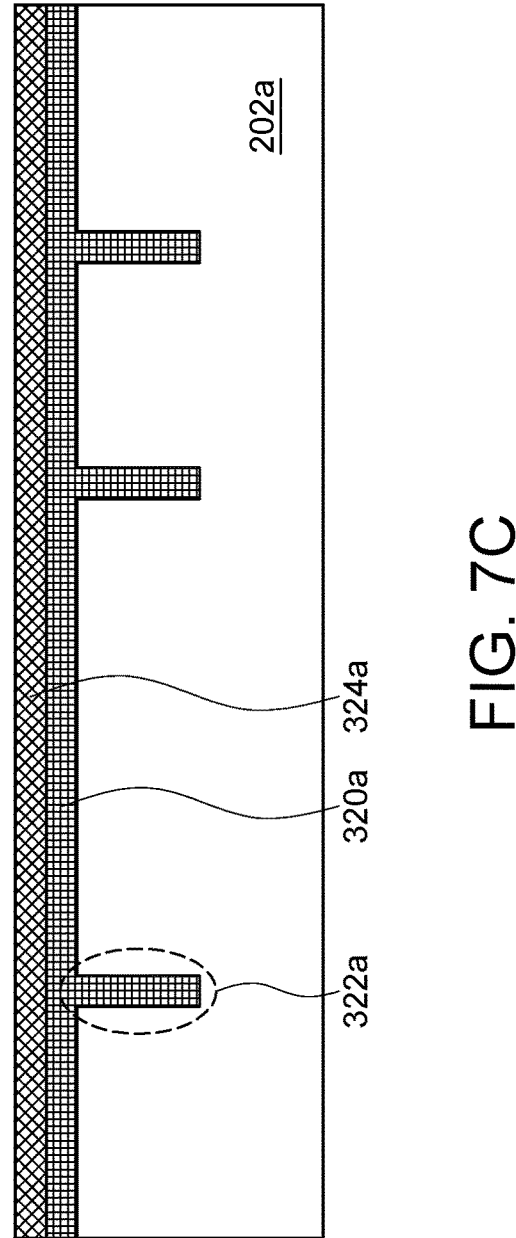

As shown in FIG. 7C, the dielectric layer 324a is formed over the sealant layer 320a. For example, one or more of the semiconductor processing tools 102-118 may perform deposition operations, CMP operations, and/or another type of operations to form the dielectric layer 324a over the sealant layer 320a.

Figure 7D:
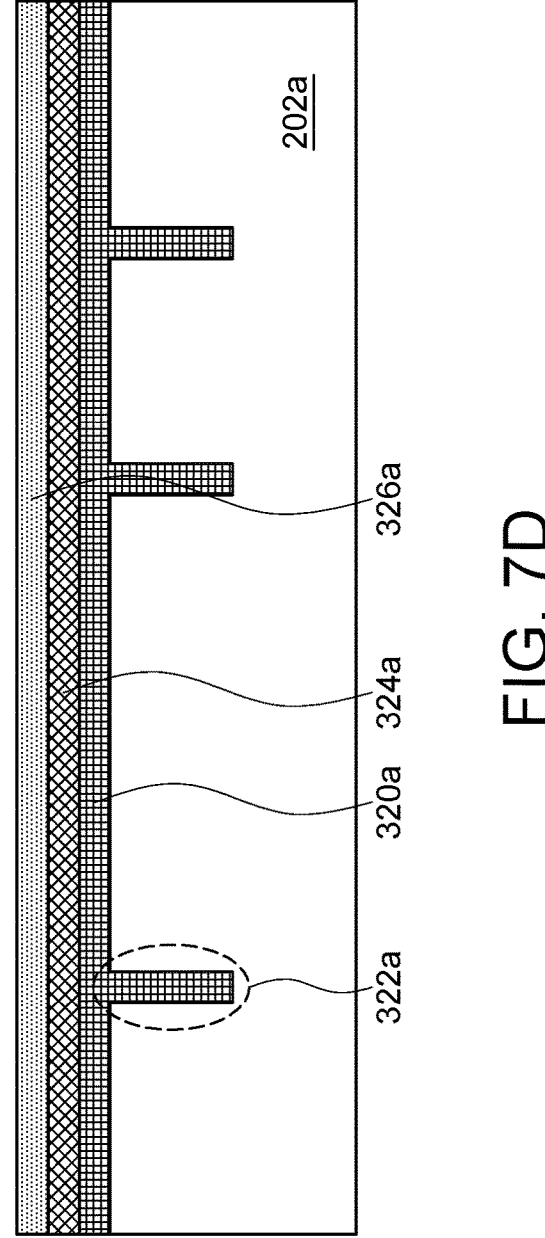

As shown in FIG. 7D, the bonding layer 326a is formed over the dielectric layer 324a. For example, one or more of the semiconductor processing tools 102-118 may perform deposition operations, CMP operations, and/or another type of operations to form the bonding layer 326a over the dielectric layer 324a.

Figure 7E:
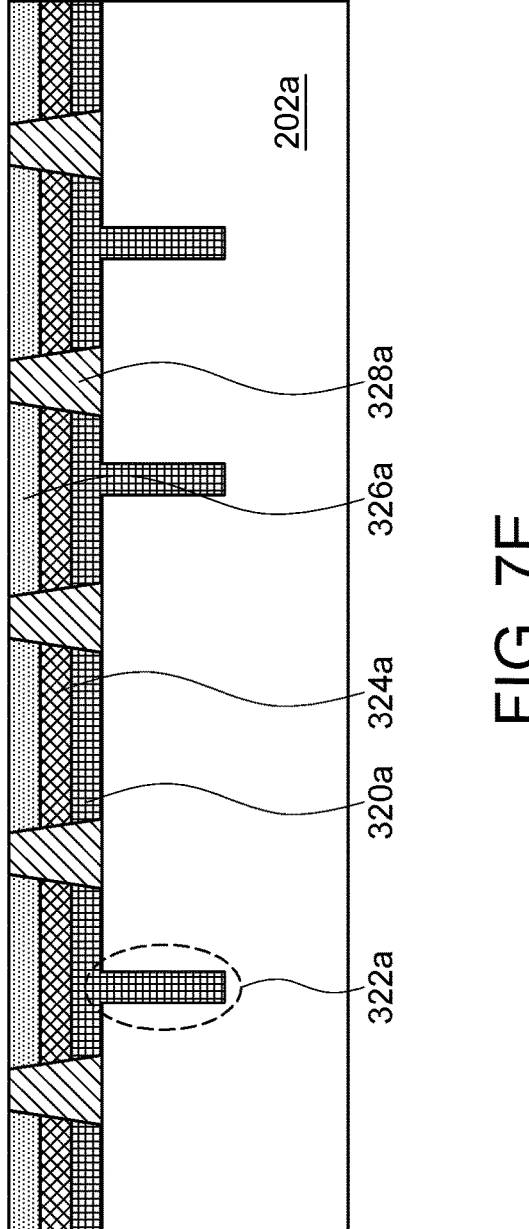

Turning to FIG. 7E, the set of interconnect structures 328a is formed through the bonding layer 326a, the dielectric layer 324a, and the sealant layer 320a. For example, and as part of forming the set of interconnect structures 328a, one or more of the semiconductor processing tools 102-118 may perform photolithography patterning operations, etching operations, deposition operations, plating operations, CMP operations, and/or another type of operations to form the set of interconnect structures 328a through the bonding layer 326a, the dielectric layer 324a, and the sealant layer 320a.

Figure 7F:
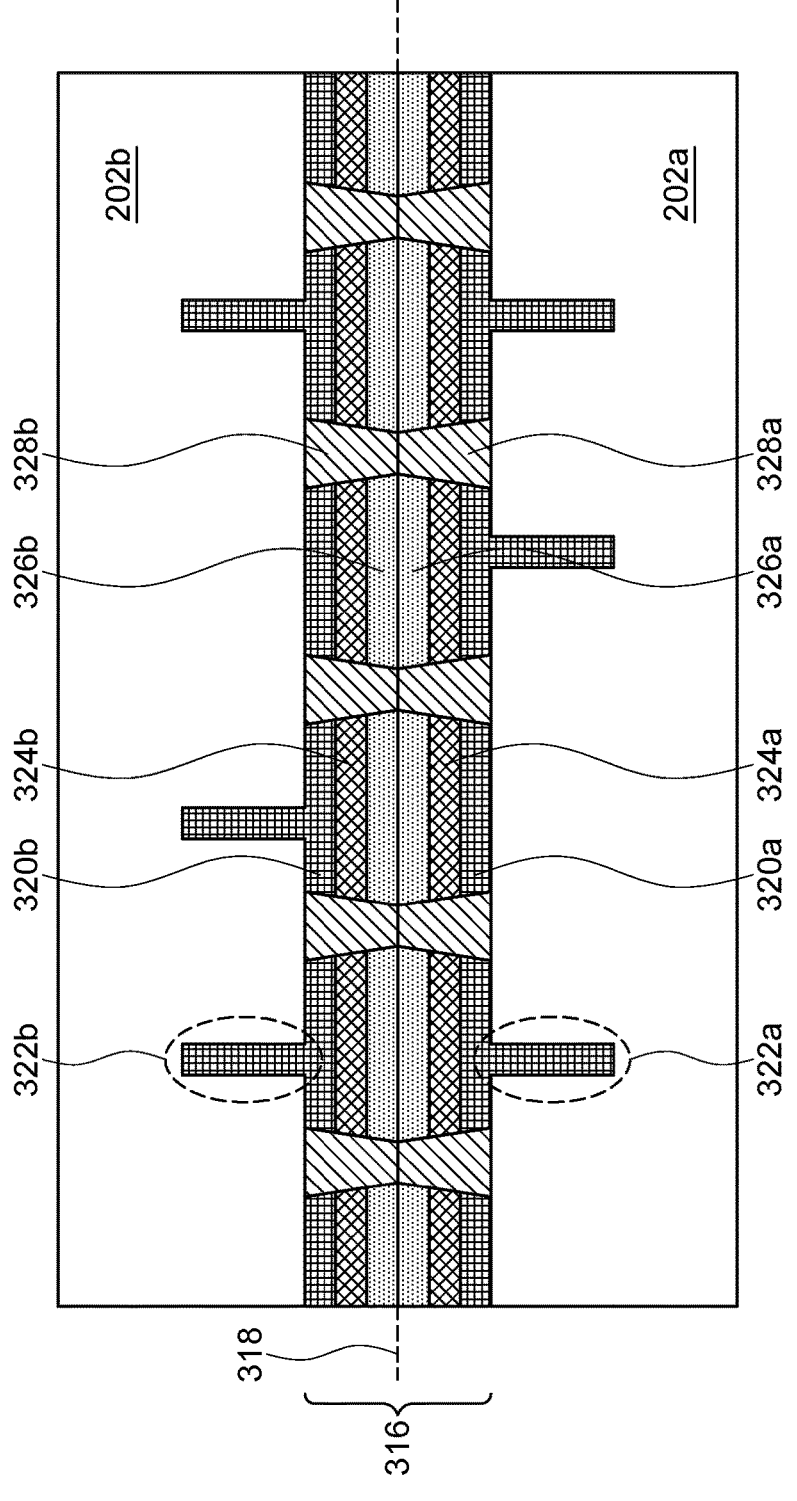

As shown in FIG. 7F, the semiconductor substrate 202a and the semiconductor substrate 202b are joined. For example, and as part of a joining the semiconductor substrate 202a and the semiconductor substrate 202b are joined one or more of the semiconductor processing tools 102-118 (e.g., the bonding tool 108) may perform a eutectic bonding operation that joins the bonding layers 326a and 326b along the bond interface 318. Additionally, or alternatively, one or more of the semiconductor processing tools 102-118 (e.g., the bonding tool 108) may perform a eutectic bonding operation that joins the sets of interconnect structures 328a and 328b along the bond interface 318. In some implementations, joining the semiconductor substrate 202a and the semiconductor substrate 202b includes forming the bond interface structure 316.

As indicated above, FIGS. 7A-7F are provided as an example. Other examples may differ from what is described with regard to FIGS. 7A-7F.

Figure 8:
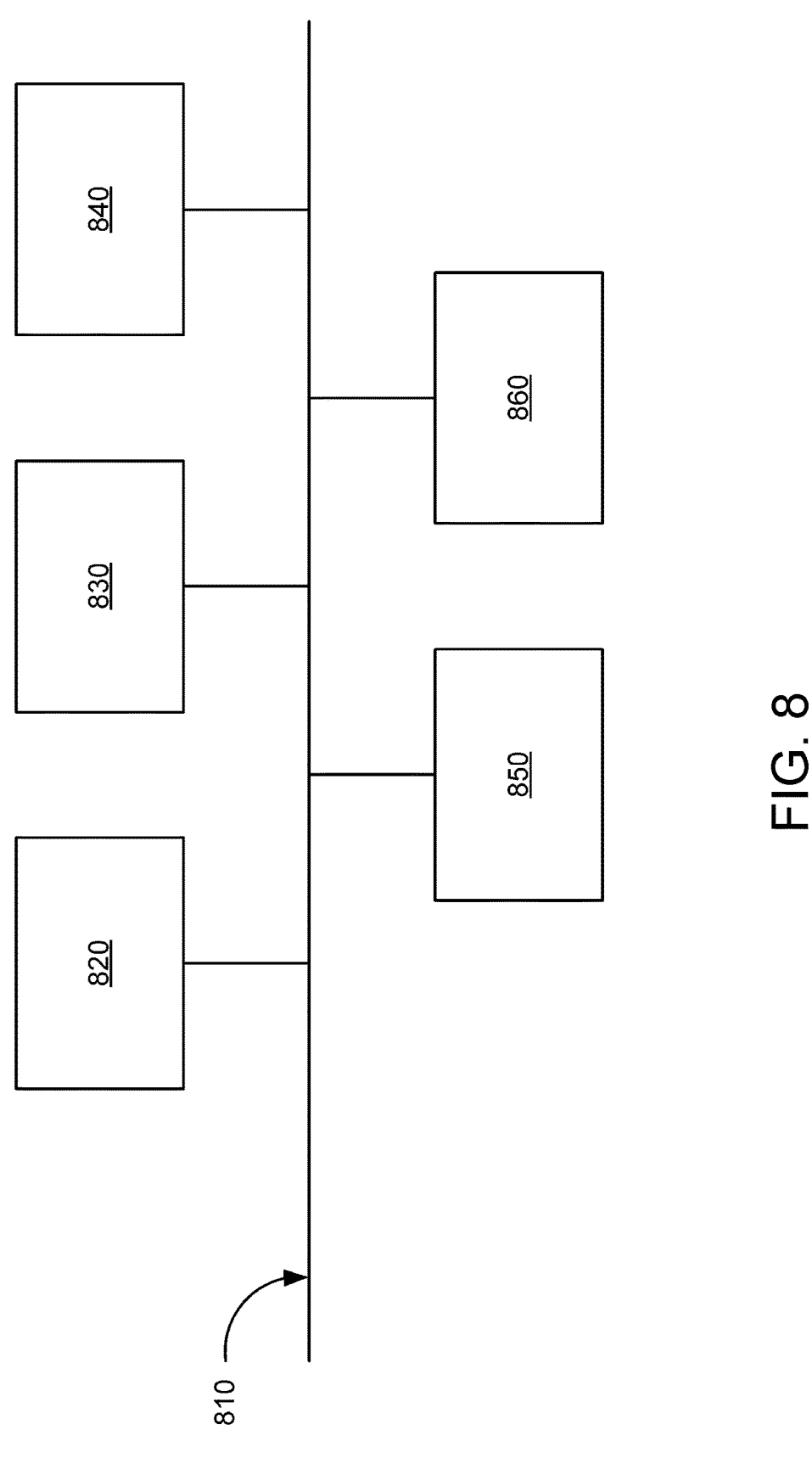
FIG. 8 is a diagram of example components of one or more devices of FIG. 1 described herein.

FIG. 8 is a diagram of example components of a device 800 associated with forming a supporting sealant layer structure for stacked die application. The device 800 may correspond to one or more of the semiconductor processing tools 102-118 and/or the transport tool 120. In some implementations, one or more of the semiconductor processing tools 102-118 and/or the transport tool 120 may include one or more devices 800 and/or one or more components of the device 800. As shown in FIG. 8, the device 800 may include a bus 810, a processor 820, a memory 830, an input component 840, an output component 850, and/or a communication component 860.

The bus 810 may include one or more components that enable wired and/or wireless communication among the components of the device 800. The bus 810 may couple together two or more components of FIG. 8, such as via operative coupling, communicative coupling, electronic coupling, and/or electric coupling. For example, the bus 810 may include an electrical connection (e.g., a wire, a trace, and/or a lead) and/or a wireless bus. The processor 820 may include a central processing unit, a graphics processing unit, a microprocessor, a controller, a microcontroller, a digital signal processor, a field-programmable gate array, an application-specific integrated circuit, and/or another type of processing component. The processor 820 may be implemented in hardware, firmware, or a combination of hardware and software. In some implementations, the processor 820 may include one or more processors capable of being programmed to perform one or more operations or processes described elsewhere herein.

The memory 830 may include volatile and/or nonvolatile memory. For example, the memory 830 may include random access memory (RAM), read only memory (ROM), a hard disk drive, and/or another type of memory (e.g., a flash memory, a magnetic memory, and/or an optical memory). The memory 830 may include internal memory (e.g., RAM, ROM, or a hard disk drive) and/or removable memory (e.g., removable via a universal serial bus connection). The memory 830 may be a non-transitory computer-readable medium. The memory 830 may store information, one or more instructions, and/or software (e.g., one or more software applications) related to the operation of the device 800. In some implementations, the memory 830 may include one or more memories that are coupled (e.g., communicatively coupled) to one or more processors (e.g., processor 820), such as via the bus 810. Communicative coupling between a processor 820 and a memory 830 may enable the processor 820 to read and/or process information stored in the memory 830 and/or to store information in the memory 830.

The input component 840 may enable the device 800 to receive input, such as user input and/or sensed input. For example, the input component 840 may include a touch screen, a keyboard, a keypad, a mouse, a button, a microphone, a switch, a sensor, a global positioning system sensor, an accelerometer, a gyroscope, and/or an actuator. The output component 850 may enable the device 800 to provide output, such as via a display, a speaker, and/or a light-emitting diode. The communication component 860 may enable the device 800 to communicate with other devices via a wired connection and/or a wireless connection. For example, the communication component 860 may include a receiver, a transmitter, a transceiver, a modem, a network interface card, and/or an antenna.

The device 800 may perform one or more operations or processes described herein. For example, a non-transitory computer-readable medium (e.g., memory 830) may store a set of instructions (e.g., one or more instructions or code) for execution by the processor 820. The processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, the processor 820 may be configured to perform one or more operations or processes described herein. Thus, implementations described herein are not limited to any specific combination of hardware circuitry and software.

The number and arrangement of components shown in FIG. 8 are provided as an example. The device 800 may include additional components, fewer components, different components, or differently arranged components than those shown in FIG. 8. Additionally, or alternatively, a set of components (e.g., one or more components) of the device 800 may perform one or more functions described as being performed by another set of components of the device 800.

Figure 9:
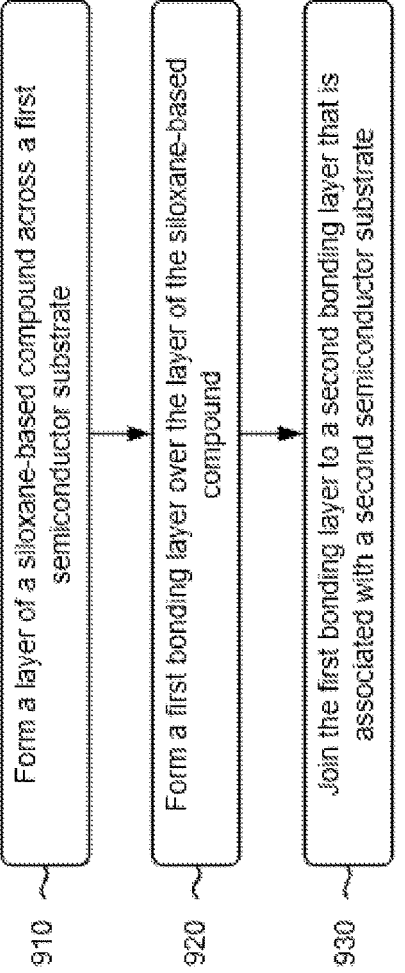

FIG. 9 is a flowchart of an example process 900 associated with forming a supporting sealant layer structure for stacked die application. In some implementations, one or more process blocks of FIG. 9 are performed by one or more semiconductor processing tools (e.g., one or more of the semiconductor processing tools 102-118 and/or the transport tool 120). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a layer of a siloxane-based compound across a first semiconductor substrate (block 910). For example, one or more of the semiconductor processing tools 102-118 and/or the transport tool 120 may form a layer of a siloxane-based compound (e.g., the sealant layer 320a) across a first semiconductor substrate (e.g., the semiconductor substrate 202a), as described herein.

As further shown in FIG. 9, process 900 may include forming a first bonding layer over the layer of the siloxane-based compound (block 920). For example, one or more of the semiconductor processing tools 102-118 and/or the transport tool 120 may form a first bonding layer (e.g., the bonding layer 326a) over the layer of the siloxane-based compound, as described herein.

As further shown in FIG. 9, process 900 may include joining the first bonding layer to a second bonding layer that is associated with a second semiconductor substrate (block 930). For example, one or more of the semiconductor processing tools 102-118 and/or the transport tool 120 may join the first bonding layer to a second bonding layer (e.g., the bonding layer 326b) that is associated with a second semiconductor substrate (e.g., the semiconductor substrate 202b), as described herein.

Process 900 may include additional implementations, such as any single implementation or any combination of implementations described below and/or in connection with one or more other processes described elsewhere herein.

In a first implementation, forming the layer of the siloxane-based compound across the first semiconductor substrate includes dispensing the layer of the siloxane-based compound across the first semiconductor substrate, and curing the layer of the siloxane-based compound.

In a second implementation, alone or in combination with the first implementation, process 900 includes forming a dielectric layer (e.g., the dielectric layer 324a) over the layer of the siloxane-based compound prior to forming the first bonding layer over the sealant layer.

In a third implementation, alone or in combination with one or more of the first and second implementations, process 900 includes forming a first set of interconnect structures (e.g., the set of interconnect structures 328b) through the first bonding layer and the layer of the siloxane-based compound, and joining the first set of interconnect structures to a second set of interconnect structures associated with the second semiconductor substrate.

In a fourth implementation, alone or in combination with one or more of the first through third implementations, process 900 includes forming one or more stress-relief cavities (e.g., the stress-relief cavities 702) in the first semiconductor substrate prior to forming the layer of the siloxane-based compound across the first semiconductor substrate.

In a fifth implementation, alone or in combination with one or more of the first through fourth implementations, forming the layer of the siloxane-based compound across the first semiconductor substrate includes filling the one or more stress-relief cavities with the layer of the siloxane-based compound.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

FIG. 10 is a flowchart of an example process 1000 associated with forming a supporting sealant layer structure for stacked die application. In some implementations, one or more process blocks of FIG. 10 are performed by one or more semiconductor processing tools and/or a wafer die transport tool (e.g., one or more of the semiconductor processing tools 102-118 and/or the transport tool 120). Additionally, or alternatively, one or more process blocks of FIG. 10 may be performed by one or more components of device 800, such as processor 820, memory 830, input component 840, output component 850, and/or communication component 860.

As shown in FIG. 10, process 1000 may include forming a first layer of a silazane-based compound over a portion of a first integrated circuit die (block 1010). For example, one or more of the semiconductor processing tools 102-118 and/or the transport tool may form a first layer of a silazane-based compound (e.g., the sealant layer 320*a*) over a portion of a first integrated circuit die (e.g., the integrated circuit die 204*a*), as described herein.

As further shown in FIG. 10, process 1000 may include forming a first dielectric layer over the first layer of the silazane-based compound (block 1020). For example, one or more of the semiconductor processing tools 102-118 and/or the transport tool 120 may form a first dielectric layer (e.g., the dielectric layer 324*a*) over the first sealant layer, as described herein.

As further shown in FIG. 10, process 1000 may include forming a second layer of the silazane-based compound over a portion of a second integrated circuit die (block 1030). For example, one or more of the semiconductor processing tools 102-118 and/or the transport tool 120 may form a second layer of the silazane-based compound (e.g., the sealant layer 320*b*) over a portion of a second integrated circuit die (204*b*), as described herein.

As further shown in FIG. 10, process 1000 may include forming a second dielectric layer over the second layer of the silazane-based compound (block 1040). For example, one or more of the semiconductor processing tools 102-118 may form a second dielectric layer (e.g., the dielectric layer 324*b*) over the second layer of the silazane-based compound, as described herein.

As further shown in FIG. 10, process 1000 may include joining the first dielectric layer and the second dielectric layer (block 1050). For example, one or more of the semiconductor processing tools 102-118 and/or the transport tool may join the first dielectric layer and the second dielectric layer, as described herein.

Process 1000 may include additional implementations, such as any single implementation or any combination of implementations described below and/or in connection with one or more other processes described elsewhere herein.

In a first implementation, forming the first layer of the silazane-based compound over the portion of the first integrated circuit die includes forming the first layer of the silazane-based compound to a thickness (e.g., the thickness D1) that is included in a range of approximately one micron to approximately twenty microns.

In a second implementation, alone or in combination with the first implementation, forming the first layer of the silazane-based compound over the portion of the first integrated circuit die includes forming the first layer of the silazane-based compound over beveled edges only (e.g., the beveled regions 510) of the first integrated circuit die.

In a third implementation, alone or in combination with one or more of the first and second implementations, forming the first layer of the silazane-based compound over the portion of the first integrated circuit die includes forming the first layer of the silazane-based compound over an entire width (e.g., the entire width 508) of the first integrated circuit die.

In a fourth implementation, alone or in combination with one or more of the first through third implementations, joining the first dielectric layer and the second dielectric layer includes joining the first dielectric layer and the second dielectric layer using a eutectic bonding process.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Some implementations described herein provide techniques and apparatuses for forming a stacked die product including two or more integrated circuit dies. A bond interface between two integrated circuit dies that are included in the stacked die product includes a layered structure. As part of the layered structure, respective layers of a sealant material are directly on co-facing surfaces of the two integrated circuit dies. The layered structure further includes one or more bonding layers between the respective layers of the sealant material that are over co-facing surfaces of the two integrated circuit dies. Relative to another bond interface structure not including the respective layers of the sealant material, the layered structure may reduce lateral stresses throughout the bond interface to reduce a likelihood of warpage of the two integrated circuit dies. Additionally, and relative to another bond interface structure not including the respective layers of the sealant material, the layered structure may include increased adhesive properties and/or increased vibration dampening properties. The reduction in lateral stresses, the increased adhesive properties, and/or the vibration dampening properties may reduce a likelihood of the bond interface cracking or peeling during a thinning operation that thins one or more of the two integrated circuit dies.

In this way, a yield of a stacked die product is increased relative to a yield of a stacked die product having a bond interface that does not include the layered structure. Additionally, or alternatively and in some implementations, a trimming operation along a perimeter of semiconductor substrates joined to form the stacked die product may be eliminated. By increasing the yield of the stacked die product and eliminating the trimming operation, a consumption of resources to manufacture a volume of the stacked die product (e.g., semiconductor manufacturing processing tools, raw materials, manpower, and/or computing resources) may be reduced.

As described in greater detail above, some implementations described herein provide a method. The method includes forming a layer of a siloxane-based compound across a first semiconductor substrate. The method includes forming a first bonding layer over the layer of a siloxane-based compound. The method includes joining the first bonding layer to a second bonding layer that is associated with a second semiconductor substrate.

As described in greater detail above, some implementations described herein provide a method. The method includes forming a first layer of a silazane-based compound over a portion of a first integrated circuit die. The method includes forming a first dielectric layer over the first sealant layer. The method includes forming a second layer of the silazane-based compound over a portion of a second integrated circuit die. The method includes forming a second dielectric layer over the second layer of the silazane-based compound. The method includes joining the first dielectric layer and the second dielectric layer.

As described in greater detail above, some implementations described herein provide a device. The device includes a first bonding layer. The device includes a first layer of a siloxane-based compound or a silazane-based compound between the first bonding layer and first integrated circuitry, where the first integrated circuitry is associated with a first integrated circuit die. The device includes a second bonding layer joined with the first bonding layer. The device includes a second layer of a siloxane-based compound or the silazane-based compound between the second bonding layer and a second integrated circuitry, where the second integrated circuitry is associated with a second integrated circuit die.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
dispensing a layer of a siloxane-based compound across a first semiconductor substrate;
curing the layer of the siloxane-based compound;
forming, after curing the layer of the siloxane-based compound, a first bonding layer over the layer of the siloxane-based compound; and
joining the first bonding layer to a second bonding layer that is associated with a second semiconductor substrate.

2. The method of claim 1, further comprising:
forming a dielectric layer over the layer of the siloxane-based compound prior to forming the first bonding layer over the layer of the siloxane-based compound.

3. The method of claim 1, further comprising:
forming a first set of interconnect structures through the first bonding layer and the layer of the siloxane-based compound; and
joining the first set of interconnect structures to a second set of interconnect structures associated with the second semiconductor substrate.

4. The method of claim 1, further comprising:
forming one or more stress-relief cavities in the first semiconductor substrate prior to dispensing the layer of the siloxane-based compound across the first semiconductor substrate.

5. The method of claim 4, further comprising:
filling the one or more stress-relief cavities with the layer of the siloxane-based compound.

6. A method, comprising:
forming a first layer of a silazane-based compound, to a thickness that is included in a range of approximately one micron to approximately twenty microns, over a portion of a first integrated circuit die;
forming a first dielectric layer over the first layer of the silazane-based compound;
forming a second layer of the silazane-based compound over a portion of a second integrated circuit die;
forming a second dielectric layer over the second layer of the silazane-based compound; and
joining the first dielectric layer and the second dielectric layer.

7. The method of claim 6,
wherein forming the first layer of the silazane-based compound over the portion of the first integrated circuit die comprises:
forming the first layer of the silazane-based compound over beveled edges only of the first integrated circuit die.

8. The method of claim 6,
wherein forming the first layer of the silazane-based compound over the portion of the first integrated circuit die comprises:
forming the first layer of the silazane-based compound over an entire width of the first integrated circuit die.

9. The method of claim 6,
wherein joining the first dielectric layer and the second dielectric layer comprises:
joining the first dielectric layer and the second dielectric layer using a eutectic bonding process.

10. A device, comprising:
a first bonding layer;
a first layer of a siloxane-based compound or a silazane-based compound between the first bonding layer and a first integrated circuitry,
wherein the first integrated circuitry is associated with a first integrated circuit die;
a second bonding layer joined with the first bonding layer;
a second layer of the siloxane-based compound or the silazane-based compound between the second bonding layer and a second integrated circuitry,
wherein the second integrated circuitry is associated with a second integrated circuit die;
a first set of connection structures interspersed through the first bonding layer and the first layer of the siloxane-based compound or the silazane-based compound; and
a second set of connection structures interspersed through the second bonding layer and the first layer of the siloxane-based compound or the silazane-based compound,
wherein the second set of connection structures joins with the first set of connection structures.

11. The device of claim 10, further comprising:
one or more stress-relief structures within the first inte-
grated circuitry.
12. The device of claim 10,
wherein the first layer of the siloxane-based compound or
the silazane-based compound and the second layer of
the siloxane-based compound or the silazane-based
compound comprise:
composite filler particulates.
13. The device of claim 10, further comprising:
a beveled region,
wherein the first layer of the siloxane-based compound
or the silazane-based compound and the second layer
of the siloxane-based compound or the silazane-
based compound are directly joined within the bev-
eled region.
14. The device of claim 10, further comprising:
an interposer, and
wherein a stacked die structure including the first
bonding layer, the first layer of the siloxane-based
compound or the silazane-based compound, the sec-
ond bonding layer, and the second layer of the
siloxane-based compound or the silazane-based
compound is attached to the interposer.
15. The device of claim 10 further comprising:
a beveled region,
wherein a bond interface structure is located between
the first layer of the siloxane-based compound or the silazane-based compound, and the second layer of
the siloxane-based compound or the silazane-based
compound, within the beveled region.
16. The device of claim 15,
wherein the bond interface structure comprises:
the first bonding layer joined directly with the second
bonding layer.
17. The device of claim 16, further comprising:
a dielectric layer between the first bonding layer and the
first layer of the siloxane-based compound or the
silazane-based compound within the beveled region.
18. The method of claim 1, wherein the layer of the
siloxane-based compound comprises composite filler par-
ticulates selected from silicon carbide (SiC), aluminum
dioxide ($Al_2O_3$), zirconium tungsten phosphate
($Zr_2WP_2O_{12}$), silica ($SiO_2$), or ceramic particulates.
19. The method of claim 6, wherein the first dielectric
layer comprises a material selected from silicon dioxide
($SiO_2$), silicon oxycarbide (SiOC), aluminum dioxide
($Al_2O_3$), undoped silicon glass, or phosphosilicate glass.
20. The device of claim 10, wherein at least one of the first
layer of the siloxane-based compound or the silazane-based
compound or the second layer of the siloxane-based com-
pound or the silazane-based compound has a thickness in a
range of approximately one micron to approximately twenty
microns.

* * * * *